United States Patent [19]

Sakamoto et al.

[11] Patent Number: 5,476,799
[45] Date of Patent: Dec. 19, 1995

[54] PROCESS FOR PREPARING SEMICONDUCTOR DEVICE USING A TUNNEL OXIDIZED LAYER

[75] Inventors: Masaru Sakamoto, Atsugi; Masakazu Morishita; Shigeru Nishimura, both of Hiratsuka, all of Japan

[73] Assignee: Canon Kabushiki Kaisha, Tokyo, Japan

[21] Appl. No.: 67,788

[22] Filed: May 27, 1993

Related U.S. Application Data

[62] Division of Ser. No. 755,452, Sep. 5, 1991, Pat. No. 5,242,858.

[30] Foreign Application Priority Data

| Sep. 7, 1990 | [JP] | Japan | 2-235893 |
| Sep. 7, 1990 | [JP] | Japan | 2-235894 |
| Sep. 28, 1990 | [JP] | Japan | 2-257248 |
| Nov. 29, 1990 | [JP] | Japan | 2-326052 |
| Jan. 22, 1991 | [JP] | Japan | 3-20269 |

[51] Int. Cl.⁶ .................................................. H01L 21/22
[52] U.S. Cl. ........................ 437/25; 437/31; 437/162; 148/DIG. 123
[58] Field of Search ....................... 437/25, 37, 46, 437/162, 31; 148/DIG. 38, DIG. 123

[56] References Cited

U.S. PATENT DOCUMENTS

| 4,624,864 | 11/1986 | Hartmann | 427/89 |
| 4,676,847 | 6/1987 | Lin | 437/162 |
| 4,728,620 | 3/1988 | Jeuch | 437/41 |
| 4,780,429 | 10/1988 | Roche et al. | 437/41 |

FOREIGN PATENT DOCUMENTS

| 0043944 | 1/1982 | European Pat. Off. . |
| 0060676 | 9/1982 | European Pat. Off. . |
| 0170544 | 2/1986 | European Pat. Off. . |
| 0177105 | 4/1986 | European Pat. Off. . |
| 0227085 | 7/1987 | European Pat. Off. . |
| 0314600 | 5/1989 | European Pat. Off. . |
| 2568723 | 7/1986 | France . |
| 8607190 | 12/1986 | France . |
| 61-208829 | 9/1986 | Japan | 437/162 |
| WO8603334 | 6/1986 | WIPO . |
| WO8604454 | 7/1986 | WIPO . |

OTHER PUBLICATIONS

Sato et al., "Enhanced Boron Diffusion Through Thin Silicon Dioxide in a Wet Oxygen Atmosphere", J. Electr. Soc., vol. 136, No. 6, Jun. 1989, pp. 1777–1781.

IBM Technical Disclosure Bulletin, vol. 32, No. 10A, Mar. 1990, pp. 90–91; "In Situ Deposition, Planarization, and Etching Of Polysilicon".

IBM Technical Disclosure Bulletin, vol. 32, No. 4A, Sep. 1989, pp. 367–370; "Process For Low Resistivity CoSi2 Contact To Very Shallow N–P Junction".

(List continued on next page.)

*Primary Examiner*—Chandra Chaudhari
*Attorney, Agent, or Firm*—Fitzpatrick, Cella, Harper & Scinto

[57] ABSTRACT

A process for preparing a semiconductor device forms an insulating thin film capable of tunnelling phenomenon of carriers on a semiconductor substrate and forms a polycrystalline semiconductor layer on the thin film. An impurity is injected to the surface of the polycrystalline semiconductor layer, the diffusion coefficient to the thin film being smaller than that to the polycrystalline semiconductor layer. The process effects a first heat treatment at a temperature of 800° C. or less to diffuse the impurity injected into the polycrystalline semiconductor layer in the polycrystalline semiconductor layer, thereby forming a uniform or substantially uniform impurity containing region at least at the thin film side of the polycrystalline semiconductor layer, and, effects a second heat treatment the temperature of which is 950° C. or less and higher than the temperature of the first heat treatment to diffuse the impurity present in the polycrystalline semiconductor layer into the semiconductor substrate through the thin film, thereby forming a diffused layer.

12 Claims, 29 Drawing Sheets

OTHER PUBLICATIONS

Solar Cells, vol. 20, No. 1, Feb. 1987, pp. 51–57, Sinke et al., "A Comparison Between Excimer Laser And Thermal Annealing etc.".

J. Appl. Phys., vol. 65, No. 10, May 1989, pp. 4036–4039, Wu et al. "Retardation of Nucleation Rate For Grain Size etc.".

J. Electrochem. Soc., vol. 135, No. 4, Apr. 1988, pp. 974–979, Cole et al. "Thin Epitaxial Silicon Regrowth etc.".

J. Electrochem. Soc., vol. 134, No. 7, Jul. 1987, pp. 1771–1777, Noguchi et al. "Advanced Superethin Polysilicon Film etc.".

Appl. Phys. Let., vol. 45, No. 8, Oct. 1984, pp. 910–912, Quach et al., "Solid phase epitaxy of polycrystalline silicon films etc.".

Pat. Abs. JP. vol. 13, No. 503, Nov. 13, 1989 and JP-A-120193.

Pat. Abs. JP. vol. 9, No. 203, Sep. 17, 1985 and JP-A-60084825.

Proc. IEEE 1988 Bipolar Circuits & Technology Meeting, Sep. 1988, pp. 132–135, van Schravendijk, "Thin base Formation etc.".

As 5E15/150
POLYCRYSTALLINE SILICON 2000Å
HEAT TREATMENT TIME 1 HOUR

As 5E15/150
POLYCRYSTALLINE SILICON 2000Å
HEAT TREATMENT TIME 1 HOUR

F I G. 16
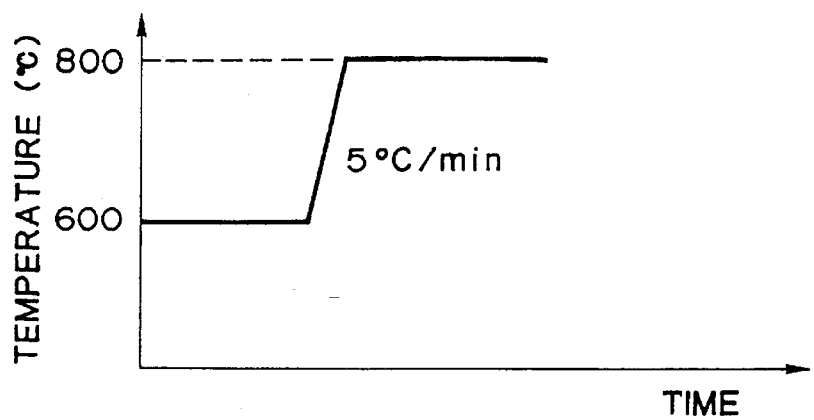
F I G. 17
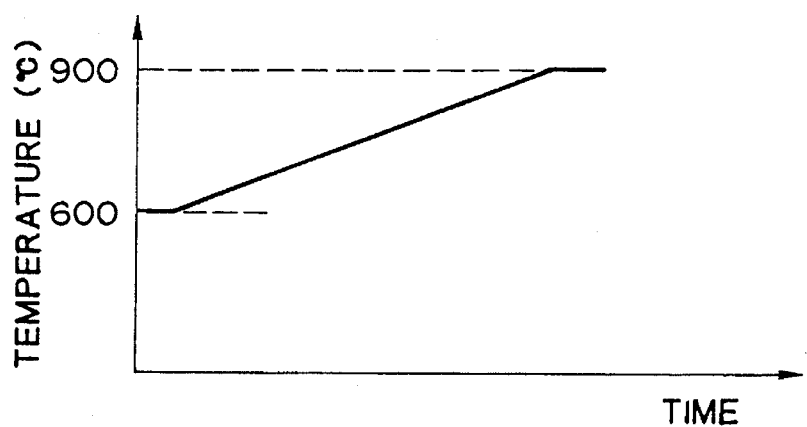
F I G. 18
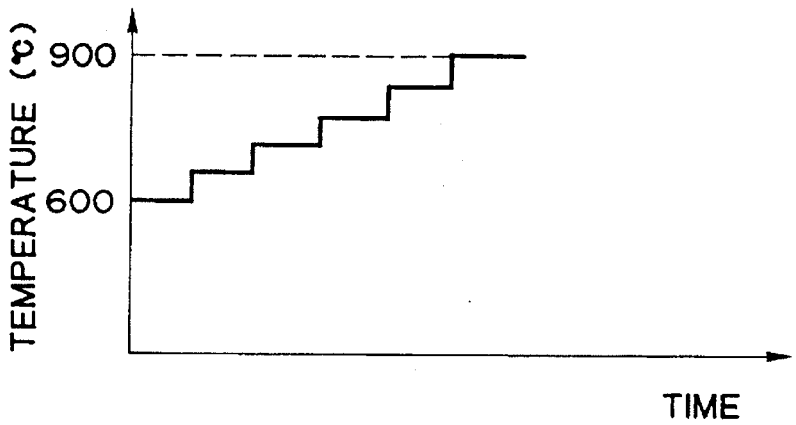

PROCESS FOR PREPARING SEMICONDUCTOR DEVICE USING A TUNNEL OXIDIZED LAYER

This application is a division of application Ser. No. 07/755,452 now U.S. Pat. No. 5,242,858 filed Sep. 5, 1991.

BACKGROUND OF THE INVENTION

1. Field of the Invention

This invention relates to a process for preparing a semiconductor device.

2. Related Background Art

Process for forming the emitter region of a bipolar transistor has the two steps of window opening, such as window opening of emitter diffusion region, impurity diffusion, window opening for electrode withdrawal, electrode formation.

Accordingly, in recent years, as the device is made finer, self-matching technique which forms window opening at one time has been actively studied, and particularly the technique by use of a polycrystalline silicon containing an impurity (Doped Poly-Si:DOPOS) is general.

More specifically, as the bipolar transistor (BPT) best suited for effecting shallowing of junction and high integration, DOPOS BPT of a polycrystalline silicon emitter which can prepare an emitter according to the self-align process has been known.

Such DOPOS BPT is used also as the wiring element, and as the method for injecting an impurity into a polycrystalline silicon, there is the ion injection method.

After an impurity has been injected according to the ion injection method into a polycrystalline silicon, heat treatment has been practiced for activation at 900° C. to 1000° C. However, for accomplishing further fine formation of the element and shallowing of the semiconductor coupling, the heat treatment temperature is required to be made lower, and for example in the process corresponding to the minimum line width 0.5 μm, a low temperature process of 800° to 900° C. has been employed.

Also, in the ion injection method of the prior art in which an impurity is injected into a polycrystalline silicon, because the ion injection conditions and the heat treatment temperature after injection are not optimum, there is the problem that the electrical resistance of the polycrystalline silicon obtained becomes larger (sheet resistance becomes larger). Particularly, this influence is marked in the low temperature process aiming at shallowing of junction.

Further, in the technique as described above, there ensue problems in progressing further finer formation of the device.

One problem is that, as the window opening dimensions are made finer, when an impurity is attempted to be introduced in the step after coating of the polycrystalline silicon, introduction of the impurity exhibits dependency on the window opening dimensions. This is described by referring to FIG. 1.

As shown in FIG. 1, when there are two kinds of transistors with different window opening dimensions, as finer formation is progressed, it may sometimes take place that the distances from the surface of the polycrystalline silicon 123 to the substrate (for example, $l_1$ and $l_2$ in the Figure) are different. For this reason, the width of the diffused layer (emitter region 111) formed on the substrate side will change from the desired one, whereby there is the problem that the characteristics of the transistor obtained become nonuniform.

FIG. 2 is a sectional view of the substrate when the diffused layer is formed in the Si substrate for illustration of the preparation process of the semiconductor device as described above. In the Figure, 201 is an Si monocrystalline substrate (hereinafter referred to as substrate), 202, 203 are diffused layers, 210 is a polycrystalline Si deposited layer, and 210A a crystal grain boundary (hereinafter referred to as grain boundary).

The diffused layer 202 is formed by injecting directly an impurity into the substrate 201 before formation of the polycrystalline deposited layer 210, and the diffused layer 203 formed by injecting the impurity through the polycrystalline Si deposited layer 201.

That is, the diffused layer 203 is formed by injecting first an impurity into the polycrystalline silicon deposited layer 210 by ion injection, and thereafter diffusing the impurity from the polycrystalline Si deposited layer 210 into the substrate 201 by the heat treatment.

However, the diffused layer 203 thus formed by the method of the prior art, as shown in the Figure, has for example a deep junction 210D formed in the junctioned region 210B between the substrate 201 and the crystal grain boundary 210A. Accordingly, the junctioned face as a whole becomes nonuniform. This may cause variance in collector current and current amplification ratio in the case of the bipolar transistor in an integrated circuit.

Further in this method, a naturally oxidized film (ca. 5Å) is formed between the substrate 1 in the step of depositing the polycrystalline Si, and the oxidized film may be partially destroyed by the heat treatment in the impurity diffusion to the substrate 1. This may cause the effective diffusion distance of small number of carriers injected into the emitter to be changed depending on the respective places in the emitter when the emitter junction is shallow, whereby variance of base current may be caused. In either case as mentioned above, the junctioned face is caused to become nonuniform, and this is a particularly important problem when the circuit formed on the substrate is highly integrated to make the thicknesses of the emitter layer and the base layer thinner.

Thus, as the higher densification and speed-up of actuation for semiconductor devices are demanded, fine formation of semiconductor device is under rapid progress. As a typical fine formation technique, the self-matching technique such as DOPOS (Doped Poly-Si) process, etc. as described above has been particularly widely applied. Whereas, as mentioned above, when the DOPOS is used as the diffusion source, many problems are accompanied. For example, there may sometimes ensue such problems as follows: (1) due to grain boundary diffusion accompanied with polycrystalline silicon, the diffused layer becomes nonuniform; (2) naturally oxidized film exists at the interface between polycrystalline silicon and monocrystalline silicon; (3) channeling occurs when an impurity is ion-injected into polycrystalline silicon; (4) resistance value is large as the property of polycrystalline silicon. In order to avoid such problems, a self-matching technique by use of a monocrystalline silicon in place of polycrystalline silicon has been also developed.

However, a monocrystalline silicon can be formed only on a monocrystalline silicon, and since the technique of growing a monocrystalline on $Si/SiO_2$ is still insufficient, when a monocrystalline region is desired to be obtained sufficiently, there is the problem that finer formation and lowering of temperature can be effected with difficulty. What inconveniences will be caused to occur in practical IC and devices by such problems will now be shown by referring to the emitter diffusion of bipolar transistor as an example.

(1) Nonuniformization of the diffused layer means the change of the base width, which brings about nonuniformity of current gain ratio ($h_{FE}$). This is vital to IC for which pairing characteristic is regarded as important.

(2) Presence of naturally oxidized film makes base current unstable, which is also a cause for nonuniformity of $h_{FE}$.

(3) The problem of channeling is vital to shallowing of diffused layer, but since it is difficult to control channeling itself, nonuniformity of depth of emitter diffused layer occurs, whereby $h_{FE}$ becomes nonuniform.

(4) Polycrystalline silicon in itself becomes higher in resistance value as compared with monocrystalline silicon, which is unavoidable as long as a polycrystalline silicon is used. If the emitter resistance becomes higher, the current becomes insufficient, leading to lowering of driving capacity.

SUMMARY OF THE INVENTION

An object of the present invention is to provide a process for preparing a semiconductor device which has solved the problems as mentioned above.

That is, an object of the present invention is to provide a process for preparing a semiconductor device which can form uniformly the diffused layer of an emitter region of a bipolar transistor (particularly finely formed bipolar transistor), and also can obtain a semiconductor device capable of obtaining transistors with uniform and stable characteristics.

Another object of the present invention is to provide a process for preparing a semiconductor device which can prepare the device without use of a special preparation device and is excellent in bulk productivity.

Still another object of the present invention is to provide a process for preparing a semiconductor device by which the resistance of a polycrystalline silicon does not become larger even when heat treatment step at a low temperature may be practiced and a shallow junction can be formed.

Still another object of the present invention is to provide a process for preparing a semiconductor device which can form a diffused layer having a uniform junctioned face.

In addition, the present invention can provide a process for preparing a semiconductor device which can prevent abnormal diffusion of impurity and polycrystal recrystallization, effect uniformization of characteristics, prevent leak of base current and enlarge the current amplification ratio.

Still another object of the present invention is to provide a process for preparing easily a semiconductor device comprising a monocrystalline silicon with uniform crystallinity even without use of a polycrystalline silicon.

Still another object of the present invention is to provide a process for preparing a semiconductor device, which can reduce variance of the characteristics when the present invention is applied to preparation of a photosensor as the semiconductor device and can provide a photoelectric converting device of high performance with good S/N ratio.

BRIEF DESCRIPTION OF THE DRAWINGS

FIGS. 16, 17, 18 are respectively diagrams showing the temperature states in the first heat treatment and the second heat treatment;

DETAILED DESCRIPTION OF THE PREFERRED EMBODIMENTS

Figure 1:
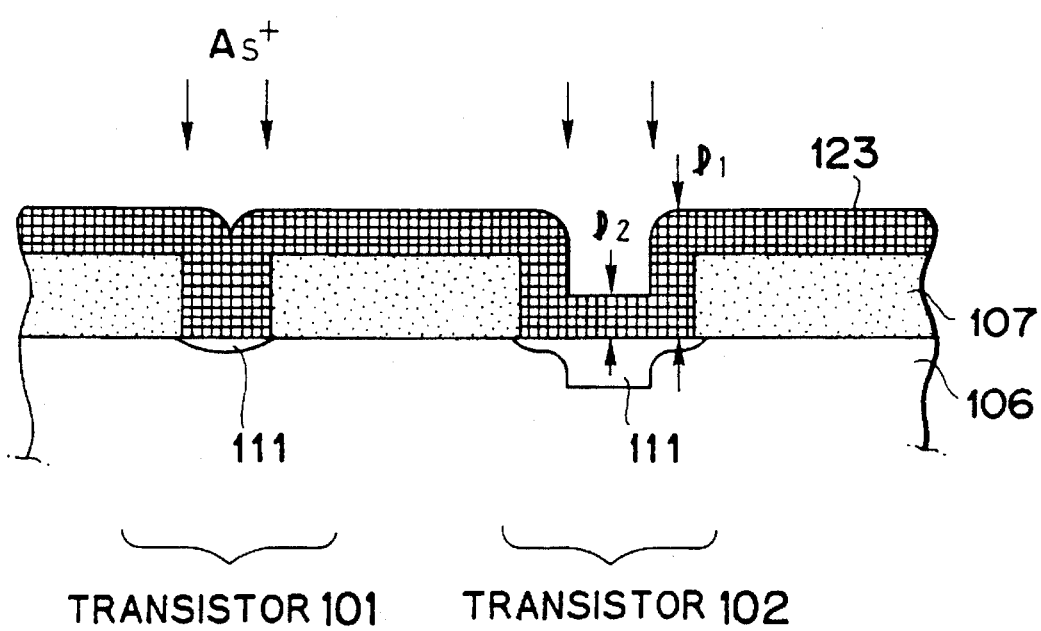
FIG. 1 and FIG. 2 are schematic sectional views of semiconductor devices.
Figure 2:
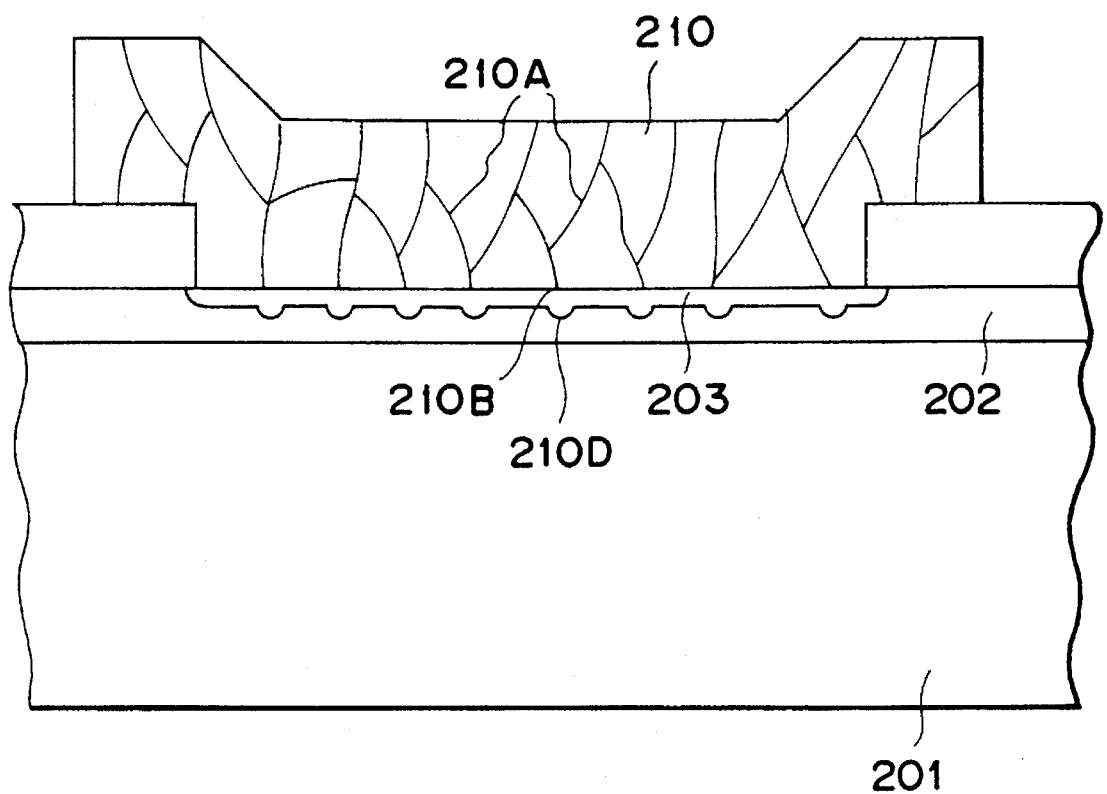

One of the processes for preparing semiconductor devices accomplishing the above objects is a process for preparing a semiconductor device, comprising the step of exposing at least a part of the main surface of a semiconductor substrate, the step of forming a layer comprising the same main components as the above substrate, the step of forming a flattening agent layer on the surface of said layer, the step of removing the above layer and the flattening agent layer at the same time, and the step of affecting impurity injection after said removing step.

Also, the above objects can be accomplished by the preparation process of a semiconductor device which forms the above flattening agent layer by coating a flattening agent, or by the preparation process of the semiconductor device by use of $SiO_2$ as the above flattening agent.

According to the preparation process as mentioned above, after formation of a polycrystalline silicon layer, by forming a flattening agent layer by, for example, coating a flattening agent, etc., and 20 removing the polycrystalline silicon layer and the flattening agent layer at the same time by etching of the whole surface, etc., the distance from the polycrystalline silicon surface to the substrate can be made uniform.

Also, since etching is effected before introduction of impurity, etching can be done uniformly to give a uniform film quality in the longitudinal direction.

Also, since impurity is introduced after flattening, in the horizontal direction, a polycrystalline silicon with uniform grain sizes and impurity concentration are obtained.

Also, by use of an inorganic type ($SiO_2$) as the flattening agent, the conditions to be employed give a selection ratio of $SiO_2$/poly-Si of 1:1 and therefore can be easily controlled.

Also, another preparation process of the semiconductor device of the present invention which accomplishes the above objects carries out the heat treatment after injection of impurity by the ion injection into the polycrystalline silicon in at least two steps.

That is, the first heat treatment is carried out at a low temperature of 600° to 650° C., whereby the grains size of the polycrystalline silicon can made larger. Next, the second treatment is carried out at 800° C. to 900° C. to have the impurity diffused.

According to such means of the present invention, the resistance value of the polycrystalline silicon can be made lower, whereby a junction which is low in sheet resistance and shallow can be formed.

Another preparation process of the semiconductor device of the present invention accomplishing the above objects has made the whole polycrystalline silicon amorphous by increasing the acceleration voltage during ion injection of impurity into the polycrystalline silicon in DOPOS BPT by use of a polycrystalline silicon emitter, and also made it possible to make smaller the resistance of the polycrystalline silicon by optimizing the heat treatment temperature for crystal restoration thereafter. That is, by making the whole polycrystalline silicon amorphous, during heat treatment, solid phase growth takes place from the substrate side, and therefore a region with large crystal grain size and high activation ratio can be obtained.

In this process, the relationship between the thickness of the polycrystalline silicon region and the thickness of the amorphous region formed when an impurity is injected into the polycrystalline silicon region is extremely important, and the above action can be realized only when the relationship is within a predetermined range. According to the results of experimentation, it has been found that a semiconductor device having excellent characteristics can be obtained when the impurity is ion injected so that the thickness t of the polycrystalline semiconductor region and the thickness Xc of the above amorphous region become the relationship of $0.8t<Xc$. Also, when ion injection is effected under the above conditions, it is possible to carry out the heat treatment at a low temperature of 600° C. to 650° C.

In still another process for preparing a semiconductor device of the present invention accomplishing the above objects, a thin film capable of tunneling phenomenon of carriers is formed on a substrate, a polycrystalline layer is formed on the above thin film, an impurity is injected from the surface of the above polycrystalline layer, with the diffusion coefficient of the above thin film being smaller than that of the impurity, the impurity injected into the above polycrystalline layer is diffused into the polycrystalline layer by the first heat treatment to form a uniform or substantially uniform impurity layer at the grain boundary between the polycrystalline layer and the above thin film, the impurity in the above uniform or substantially uniform impurity layer is diffused into the substrate through the above thin film to form diffused layers to form the respective parts of the device.

By doing so, the impurity injected from the polycrystalline layer surface by the first heat treatment is diffused into the polycrystalline layer to form a uniform or substantially uniform impurity layer at the grain boundary layer between the polycrystalline layer and the thin film. Then, by the second heat treatment, the impurity in the above uniform or substantially uniform impurity layer is diffused through a thin film into the substrate, whereby diffused layers having a uniform junctioned face which become the respective parts of the device can be formed.

According to another process for preparing a semiconductor device of the present invention accomplishing the above objects, by use of an amorphous silicon in place of a polycrystalline silicon as the diffusion source, the grain boundary diffusion can be inhibited, and also the problem of channeling can be avoided. Also by ion injection of an impurity into an amorphous silicon, its resistance value can be lowered to about ⅕ of an ordinary polycrystal.

Amorphous silicon becomes lower in resistance as compared with polycrystalline silicon, because of the nucleation density in the film, and a polycrystalline or monocrystalline silicon with large grain sizes can be obtained by recrystallization after the heat treatment.

The amorphous layer can be also formed by ion injecting an impurity of the group IV at a predetermined concentration into a polycrystalline silicon, and thereafter applying heat treatment to effect monocrystal formation by recrystallization. Since channeling exists in a substrate in which planar direction exists, an amorphous layer is formed by injecting electrically inactive ions such as Si, Ge, etc. The critical concentration for forming an amorphous layer is about $2E19cm^{-3}$ for both Si and Ge. By such ion injection, the region before reaching the substrate excellent in crystallinity is made amorphous, whereby recrystallization from the substrate will readily take place. For amorphous silicon, since nucleus exists within the amorphous region, by affecting amorphous formation by ion injection, recrystallization further excellent in crystallinity will take place.

EXAMPLE 1

Figure 3A:
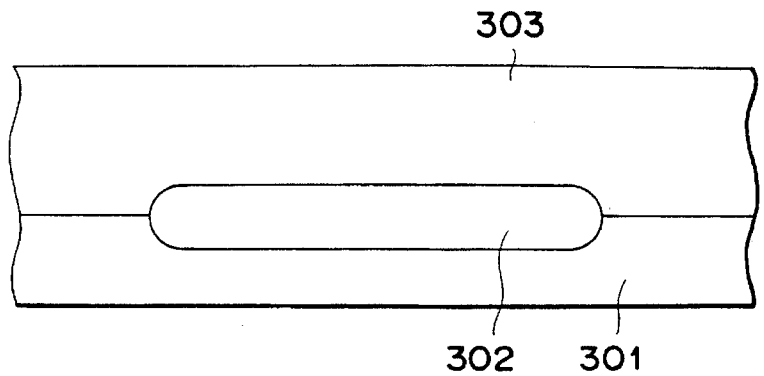
FIGS. 3A–3E, FIGS. 5A–5D, FIGS. 6A and 6B, FIGS. 11A–11E, FIGS. 15A–15F, FIGS. 24A–24E, FIGS. 26A–26C are respectively sectional views for illustration of the preparation of the Examples of the present invention.
Figure 3B:
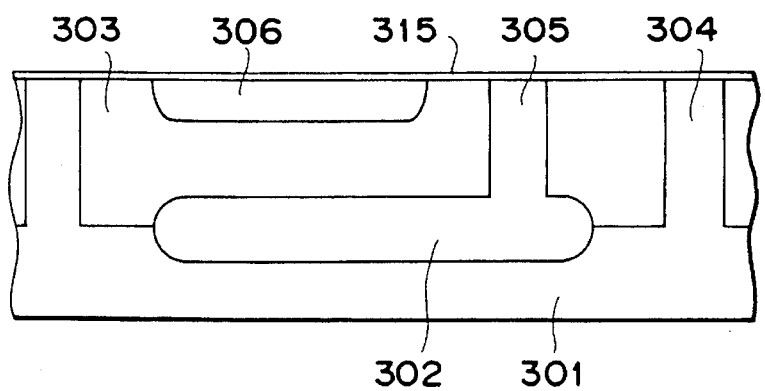
Figure 3C:
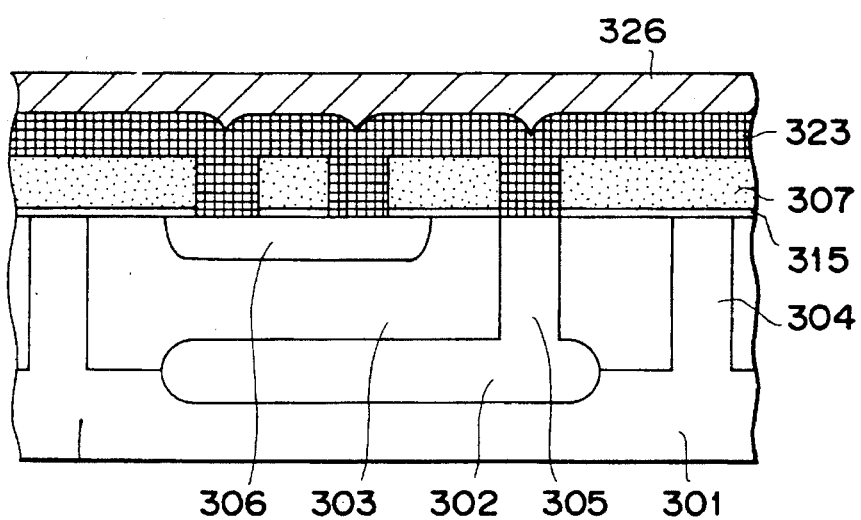
Figure 3D:
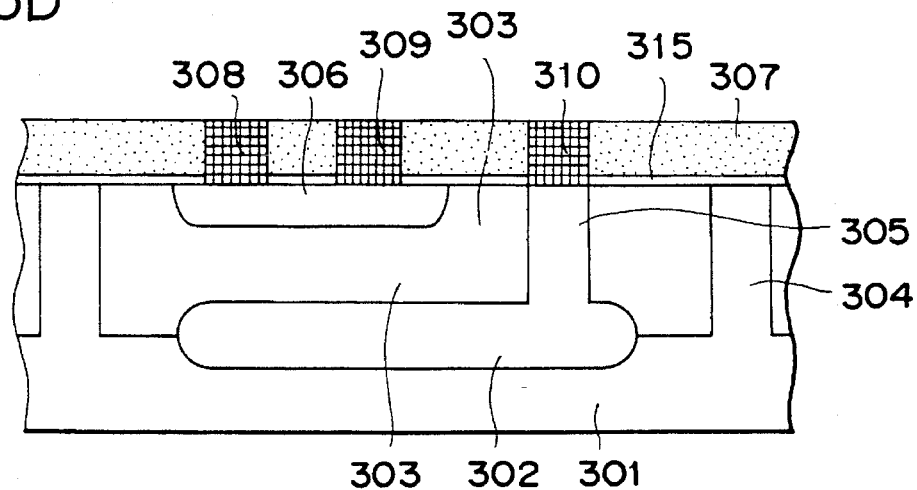
Figure 3E:
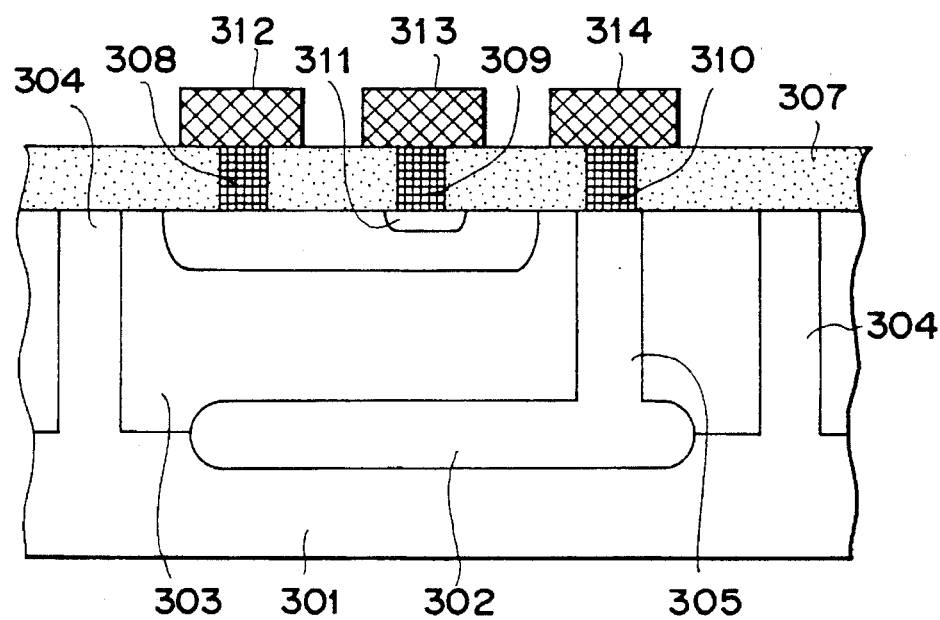

FIGS. 3A–3E are respectively schematic sectional views for illustration of the preparation step of the bipolar transistor utilizing the present invention, and FIG. 3E is the Figure showing schematically the whole constitution of the bipolar transistor prepared in this Example.

Referring first to FIG. 3E, the constitution of the bipolar transistor prepared in this Example is described. In the same Figure, 301 is a P-type silicon substrate, 302 an N-type embedded region provided for collector resistance reduction, 303 an N-type epitaxial region, 304 a P-type element separation region, 305 a collector region, 306 a base region, 307 an interlayer insulating film, 308 a P-type DOPOS region, 309, 310 are respectively N-type DOPOS regions, 311 an emitter region, 312, 313, 314 are respectively wiring metals.

In the following in the order of FIG. 3A to 3E, the preparation process according to this Example of the transistor as described above is described.

First, the P-type silicon substrate 301 of <111> is thermally oxidized to open a window at the desired region. Subsequently $As^+$ was ion injected and heat treatment was applied to form the embedded region 302.

Next, the thermally oxidized film (not shown) was peeled off from the whole surface, and epitaxial growth was effected. The growth conditions were under normal pressure, with the substrate temperature being made 1050° to 1100° C., and $SiH_2Cl_2$ as the starting gas being pyrolyzed, to form the epitaxial layer 303 with a film thickness of about 1 to 2 µm (FIG. 3A).

Next again, this was thermally oxidized to about 100 to 1500Å, and a window was opened at the desired position by use of a resist (not shown), followed by ion injection of $B^+$. After the resist was peeled off, by using again a resist, window opening was effected at the collector region 305, followed by ion injection of $Ph^+$. After the resist was peeled off, by application of heat treatment, the element separation region 304 and the collector region 305 were formed.

Next, window opening of the base region 306 was effected again with a resist, followed by ion injection of $B^+$, and heat treatment was applied to form the base region 306 (FIG. 3B).

Next, the formation method of the DOPOS region which is the point in this Example is described.

First, the interlayer insulating film 307 was formed by CVD to 5000 to 10000Å. This film may be either $SiO_2$ or a PSG (Phospho-Silicate Glass) film with an impurity added. Subsequently, this was subjected to heat treatment (800° to 1100° C.) to improve the film quality, and then window opening effected at a desired position.

Window opening dimensions are becoming smaller as the device is made finer, but there is no problem at all in coverage, etc., provided that the opening angle is 90° C. or more. On the contrary, for making the stepped difference smaller, the film thickness of the flattening agent can be made thinner if the window opening dimensions are made as small as possible.

Next, a polycrystalline silicon was formed by LP-CVD. This was done by pyrolyzing $SiH_4$ at 500° to 650° C., about 0.1 to 10 Torr, whereby the polycrystalline silicon film 323 with good coverage was formed. The film thickness was made about 500 to 10000Å. When openings of 0.1 µm square were to be embedded with the progress of finer formation, 500Å was sufficient.

Subsequently, the flattening agent 326 was coated. As the material, a resist of 1 to 5cp, or an inorganic type SOG was employed, and coated to about 2000Å (FIG. 3C).

Subsequently, this was applied with the whole surface etching (etch-back) with no selectivity, thereby removing the flattening agent 326 and the polycrystalline silicon 323 (FIG. 3D).

Subsequently, into the regions 309, 310 of the N-type DOPOS flattened were ion injected $As^+$ or $Ph^+$, and similarly into the region 308 of the P-type DOPOS similarly flattened was ion injected $B^+$, followed by heat treatment (800° to 1100° C.), to form the emitter region 311 as shown in FIG. 3E.

Finally, the wiring metals 312 to 314 were formed to complete the bipolar transistor as shown in FIG. 3E.

In this Example, since etching is effected under the state without introduction of impurity, the film quality is uniform in the longitudinal direction, and by use of an inorganic type ($SiO_2$) as the flattening agent, the condition is to make the selection ratio of $SiO_2$/poly-Si 1:1, whereby control becomes easier.

Also, when an impurity is introduced, the peripheral portion is separated with an oxidized film, and therefore the alignment margin can be also made larger.

Figure 4:
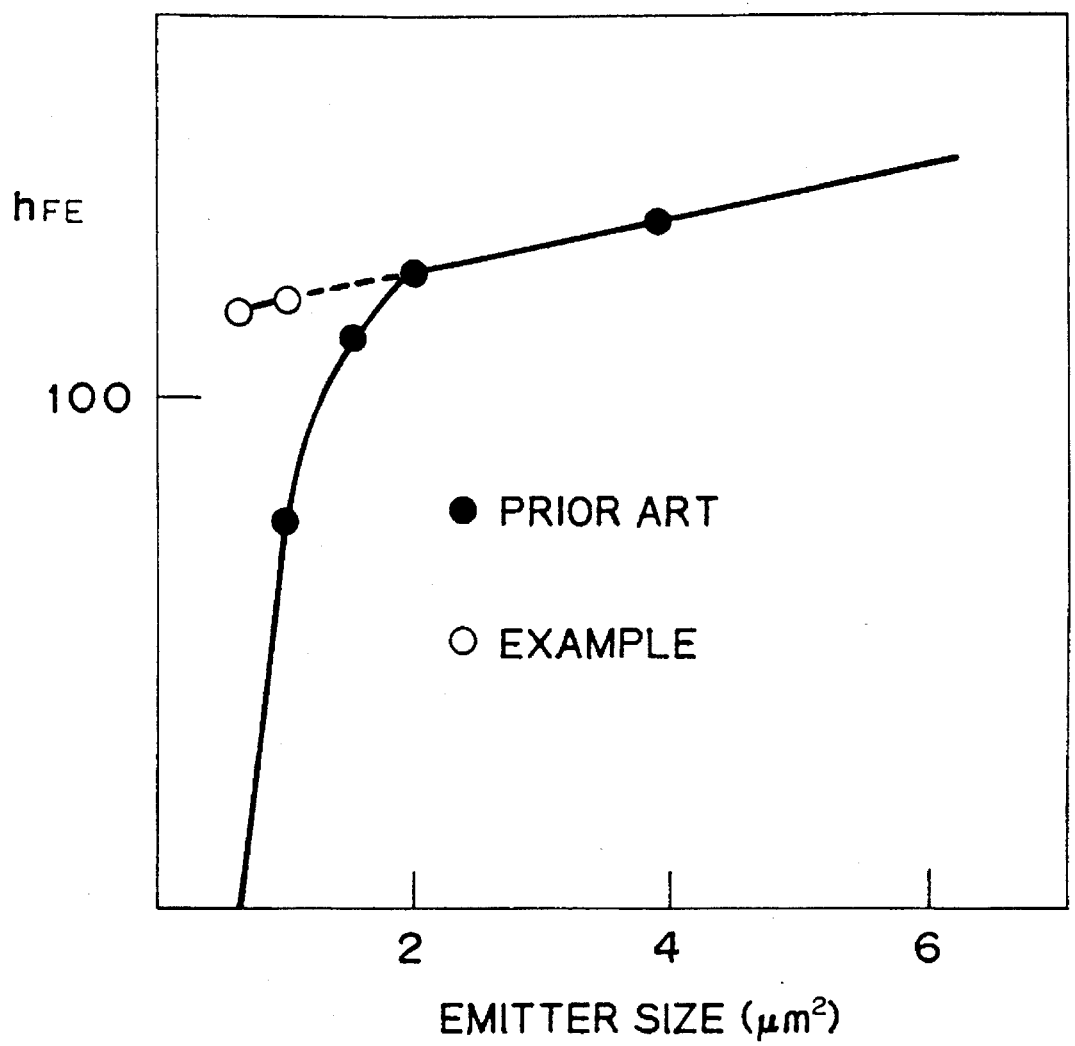
FIG. 4 is a graph showing the relationship of $h_{FE}$ versus emitter size.

FIG. 4 shows $h_{FE}$ for the emitter size of the bipolar transistor formed by use of this Example, and for that of the prior art type bipolar transistor.

As shown in the same Figure, the emitter size dependency has become smaller by use of this Example. Further, when compared with the bipolar transistor of the same size, $h_{FE}$ variance becomes smaller.

EXAMPLE 2

As the emitter of the bipolar transistor is made finer, by utilizing the present invention, it becomes possible to form polycrystalline silicon with different film thicknesses on the emitter portion and the field.

In the following, a simultaneous preparation process of high resistance polycrystalline silicon and low resistance DOPOS is illustrated by referring to schematic sectional views in FIGS. 5A to 5D.

Figure 5A:
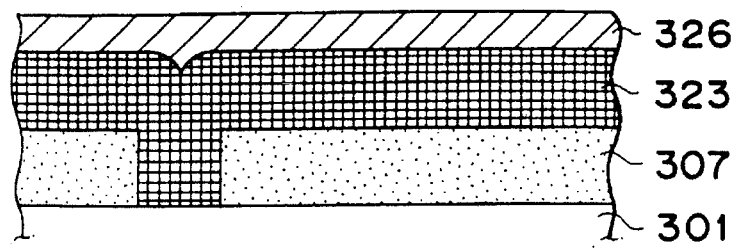

Similarly as in the Example as described above, after coating the flattening agent 326 on the silicon substrate 301, the insulating film 307, the polycrystalline silicon 323, a constitution as shown in FIG. 5A was obtained. This is the same as in FIG. 3C.

Figure 5B:
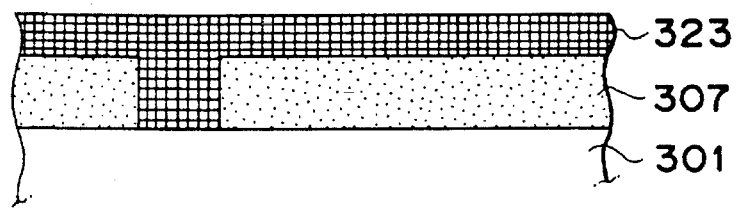

By subjecting the whole surface of this to etching, one with a constitution as shown in FIG. 5B was obtained. Here, the polycrystalline silicon 323 all on the insulating film 307 is not removed as in FIG. 3D.

Figure 5C:
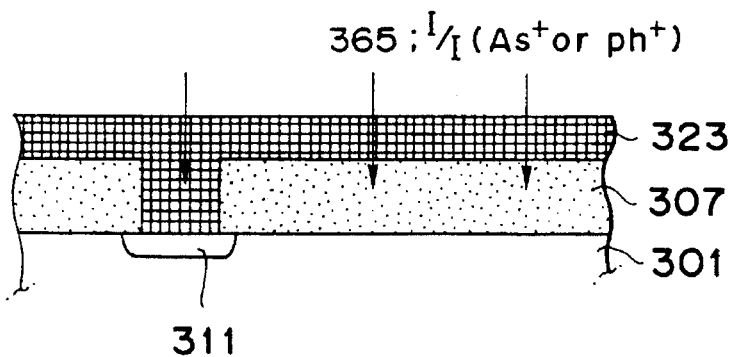

Next, as the emitter diffusion source, $As^+$ or $Ph^+$ is ion injected. By selecting the acceleration voltage, no doping is effected in the polycrystalline silicon 323 on the field, but only doping could be effected selectively at the DOPOS portion of the emitter 311 (FIG. 5C).

Figure 5D:
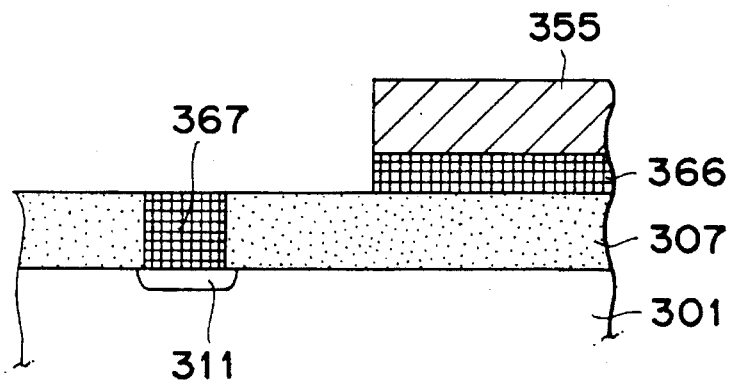

Subsequently, only the portion of the polycrystalline silicon 322 which is desired to be used as the high resistance layer 366 was left to remain by patterning of the resist 355 and applied with etching (FIG. 5D).

According to the method as described above, by use of one layer of polycrystalline silicon layer, it has become possible to obtain the high resistance polycrystalline silicon 366 and the low resistance DOPOS 367.

EXAMPLE 3

Figure 6A:
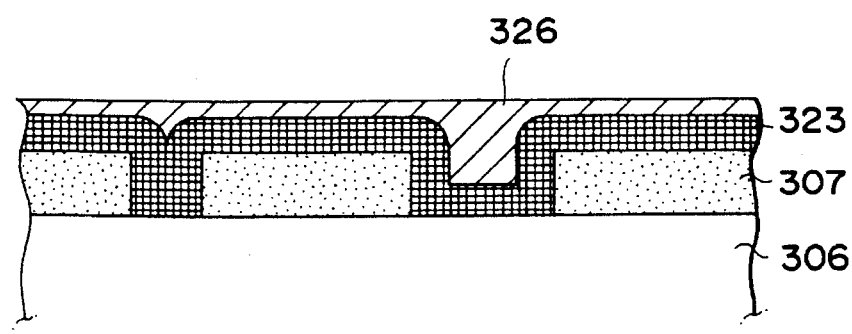
Figure 6B:
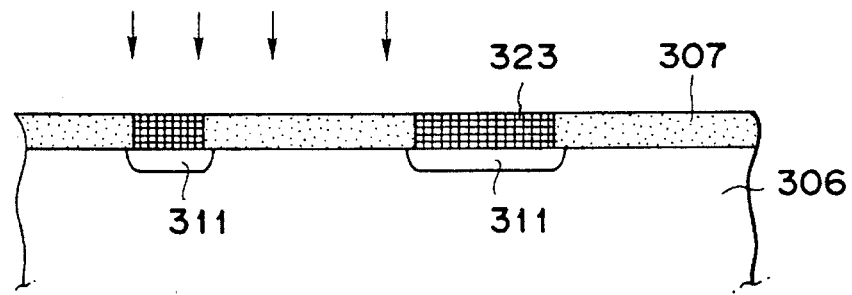

FIG. 6A and FIG. 6B are schematic sectional views for illustration of the Example when the simultaneous preparation process of the present invention was used in the case of forming two kinds of transistors with different window opening dimensions, respectively.

Similarly as in the Example as described above, after formation of the base region 306, the insulating film 307, the polycrystalline silicon layer 323, the flattening agent 326 was coated (FIG. 6A).

Next, by removing the flattening agent 326 and the polycrystalline silicon layer 323 by the whole surface etching without selectivity (etch-back), a flat surface can be obtained. Then, according to the impurity introducing step, a uniform emitter region 311 could be obtained (FIG. 6B).

Subsequently, although the drawing and description are omitted, a transistor could be formed according to the same steps as in the Example as described above.

EXAMPLE 4

The present invention can be expected to give further greater effect in the bipolar transistor utilizing the potential barrier in the polycrystalline silicon.

In the case of such transistor, since the grain size and the impurity concentration of the polycrystalline silicon have distributions in the thickness direction, there has been the problem that it is difficult to effect uniform etching. Also, since its wire resistance is large, the whole size must be made as small as possible.

In the present invention, since impurity is introduced after etching, etching can be performed uniformly, and also the polycrystalline silicon remains only in the grooves subjected to window opening, and therefore the problem as mentioned above can be solved.

Figure 7A:
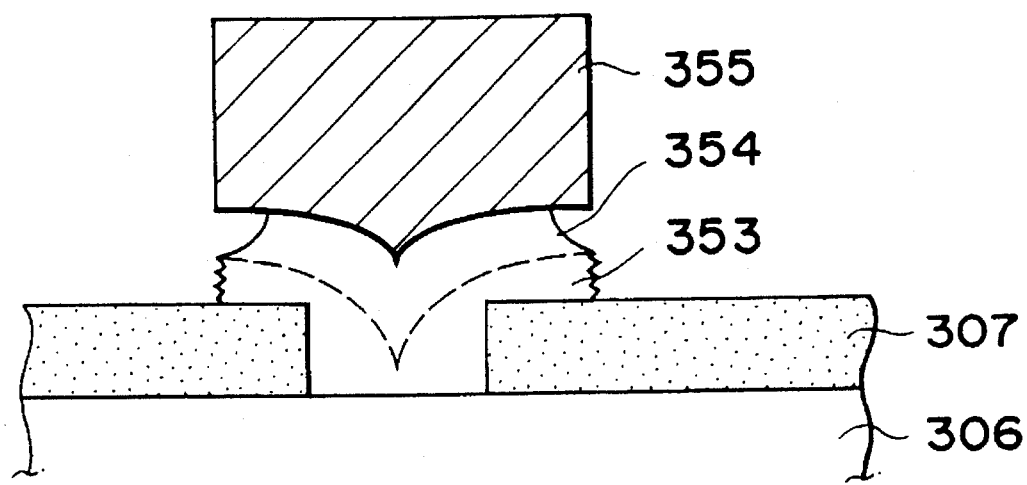
FIGS. 7A and 7B, FIG. 8, FIG. 25 are schematic sectional views of semiconductor devices.
Figure 7B:
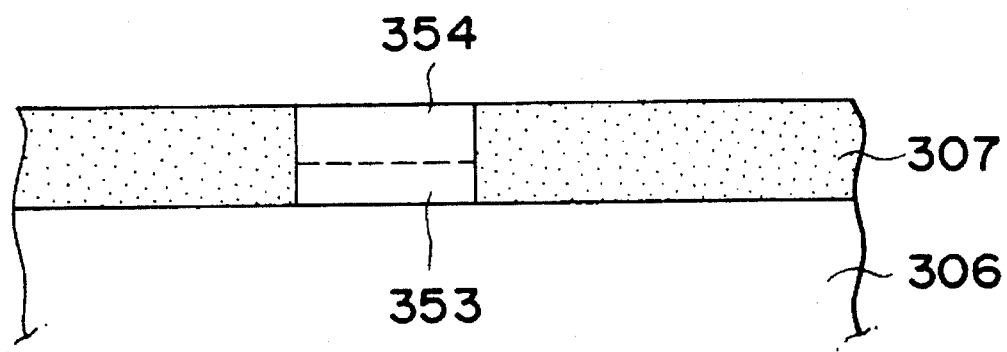

Referring now to Figs. 7A and 7B, an example of such transistor is to be described.

FIG. 7A is a schematic partial sectional view of a transistor according to the preparation process of the prior art, in which 306 is the base region, 307 the interlayer insulating film, 353 the DOPOS region having low concentration impurity, 354 the DOPOS region having high concentration impurity, and 355 the resist. As shown in the Figure, in the DOPOS of the prior art, since etching is applied after impurity introduction, the sectional shape becomes disturbed by the grain size of the polycrystalline silicon, the impurity concentration.

However, FIG. 7B is a schematic partial sectional view of a transistor according to the preparation process of the present invention, and as shown in the Figure, so far as the preparation process of the present invention is utilized, there exists no section as shown in FIG. 7A and therefore there is no problem as mentioned above.

Also, since impurity is introduced after flattening, in the horizontal direction, uniform grain size polycrystalline silicon and impurity concentration can be obtained.

EXAMPLE 5

Figure 8:
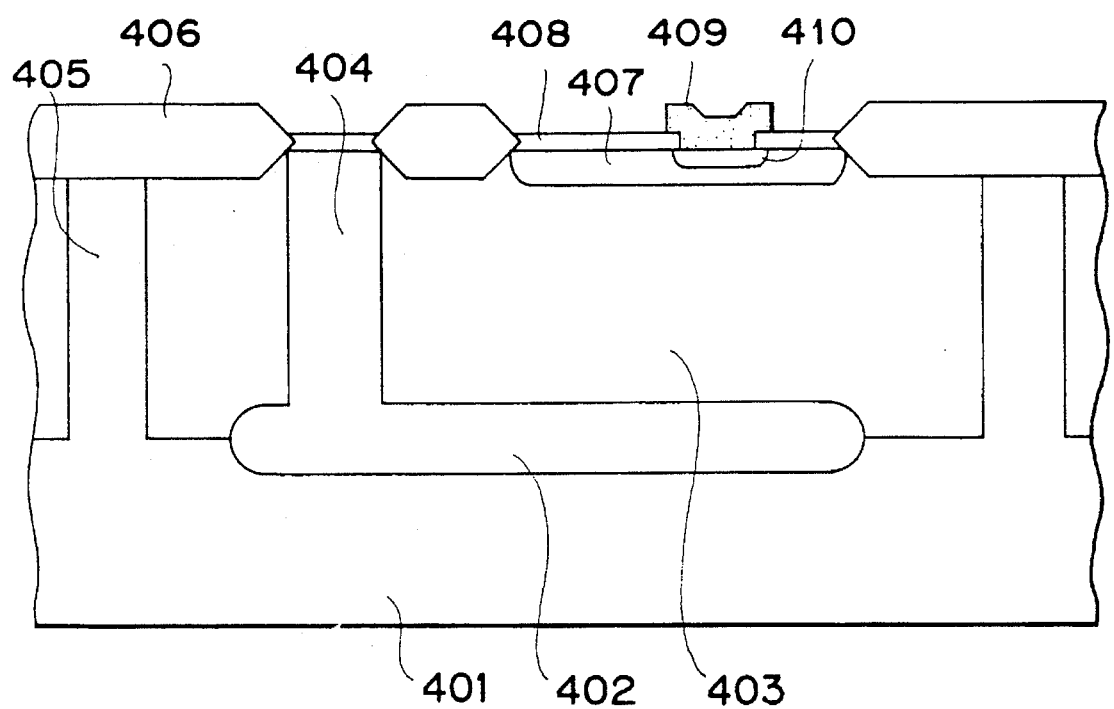

FIG. 8 is a schematic sectional view for illustration of an example in which the present invention is used for the emitter of a bipolar transistor.

This Example, as shown in the Figure, has the $n^+$ embedded layer 402 for reducing the collector resistance of an NPN bipolar transistor formed on the silicon substrate 401, and the $n^-$ epitaxial layer 403 which becomes the collector formed thereafter.

Then after forming the $n^+$ layer 404 and the $p^+$ layer 405 which becomes the element separation region in the same meaning as the $n^+$ embedded layer 402, a thick oxidized layer 406 was formed on the surface, and subjected to patterning according to the photoetching method.

Next, after the $p^-$ layer 407 which is the base of the NPN bipolar transistor was formed according to the ion injection method, a thin oxidized film 408 was formed.

Next, after a direct contact which becomes the impurity diffusion outlet of the emitter was formed by the photoetching method, the polycrystalline silicon 409 was formed to about 0.2 μm at about 600° C. according to the low pressure CVD method.

Next, on the film were injected arsenic ions which become the impurity of the emitter at an injection amount of $5 \times 10$ (/cm$^2$) and an acceleration voltage of 150 (keV).

Then, in carrying out the heat treatment for activation, the heat treatment in the first step was conducted at 650° C. for one hour, and the heat treatment in the second step at about 800° C. to 900° C. for one hour, to form the $n^+$ layer 410 which becomes the emitter.

Figure 9:
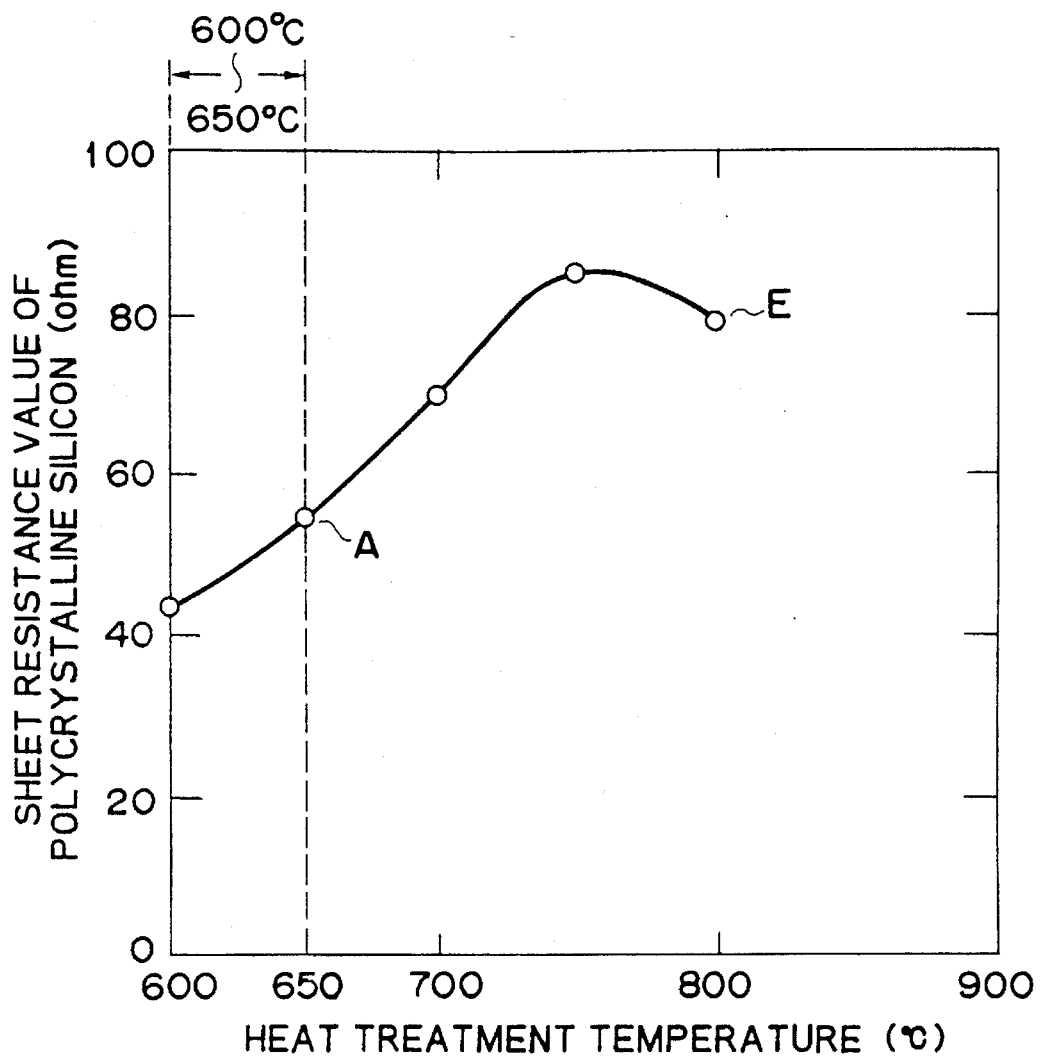
FIG. 9, FIG. 10 are graphs showing the relationships between heat treatment temperature and sheet resistance of polycrystalline silicon.

FIG. 9 shows the heat treatment temperature and the sheet resistance value of the polycrystalline silicon when the heat treatment was carried out only once. In this Example, as shown by the point A, by carrying out the heat treatment at a very low temperature of 650° C., a low sheet resistance value is exhibited. This may be considered to be because the crystal grains become larger in this temperature region.

Figure 10:
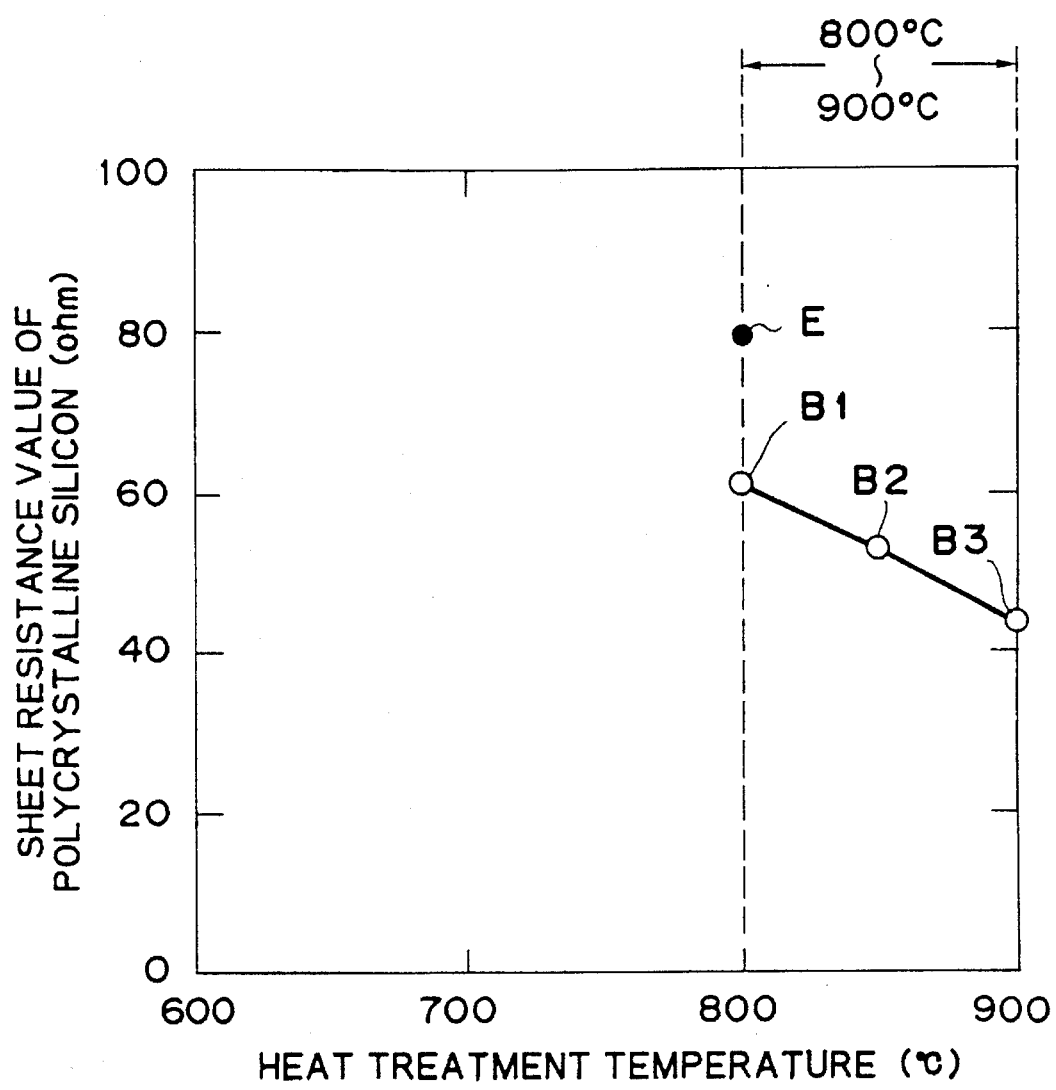

FIG. 10 shows the relationship between the heat treatment temperature for the second time and the sheet resistance value of the polycrystalline silicon obtained from the Example. Also, for the purpose reference, the values when the heat treatment was carried out only once (800° C., one hour) are shown by the point E. The points B1 to B3 in the Figure respectively show the results of the present embodiment, but as shown in the Figure, according to this Example, the sheet resistance value of the polycrystalline silicon could be reduced.

In this Example, arsenic was employed as the impurity in the polycrystalline silicon, but it may be also phosphorus. Also, the present invention is effective as the means for lowering resistance when the polycrystalline silicon is used as wiring or the gate electrode of MOS transistor.

EXAMPLE 6

In the following, an example when the process of the present invention is applied to preparation of a bipolar transistor is described by referring to schematic sectional views in FIGS. 11A to 11E.

Figure 11A:
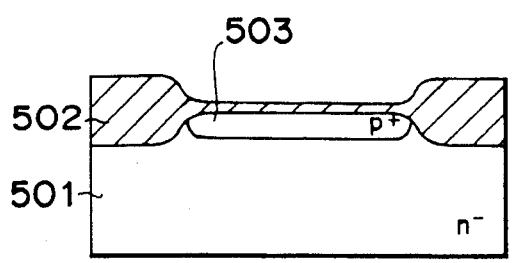
Figure 11D:
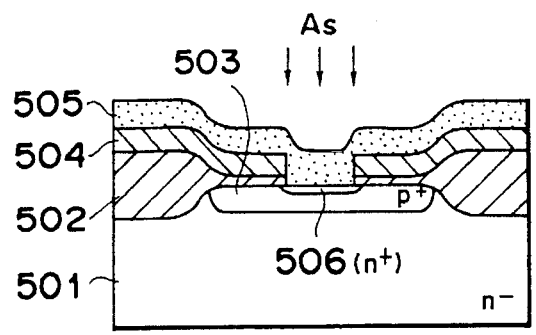
Figure 11B:
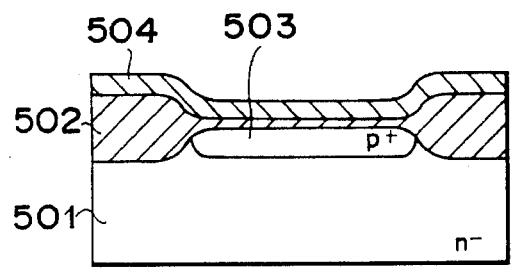
Figure 11E:
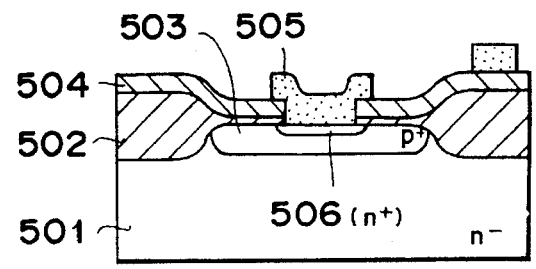
Figure 11C:
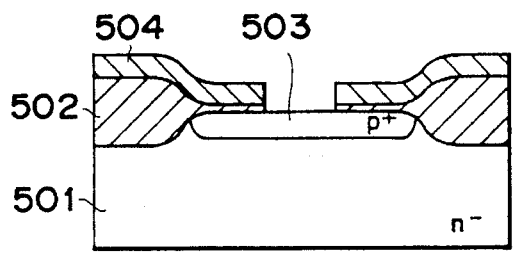

First, after forming the SiO$_2$ film 502 having a thin gate oxidized film region at the predetermined portion on the surface of the silicon substrate 501, the base of $p^+$ 503 was formed by ion injection through the gate oxidized film region (FIG. 11A). Next, according to conventional CVD method, the SiO$_2$ film 504 was deposited with a thickness of about 1000Å or more at a temperature of about 400° C. (FIG. 11B). The thickness of the SiO$_2$ film 504 was set at a thickness to the extent which can prevent the thickness of the base surface from changing by thrusting the impurity (As in this example) ion injected into the polycrystalline silicon in the subsequent steps. Then, on the gate oxidized film of the SiO$_2$ film 502 and the SiO$_2$ film 504, direct contact was formed according to the photoetching method (FIG. 11C). On the direct contact was deposited the polycrystalline silicon layer 505 with a thickness of 2000Å at a temperature of about 600° C. by use of the low pressure CVD method, and As was injected thereon according to the ion injection method in an injected amount of 5E15 to 1E16/cm$^2$ at an acceleration voltage of 150 keV to 200 keV, followed by application of heat treatment at a low temperature of about 650° C. for one hour (FIG. 11D). The injected amount of As was made the condition of making the polycrystalline silicon amorphous, and in the case of As, 3E14/cm$^2$ or higher. Then, by patterning of the polycrystalline silicon layer, the emiter 506 of DOPOS BPT was formed (FIG. 11E).

Figure 12:
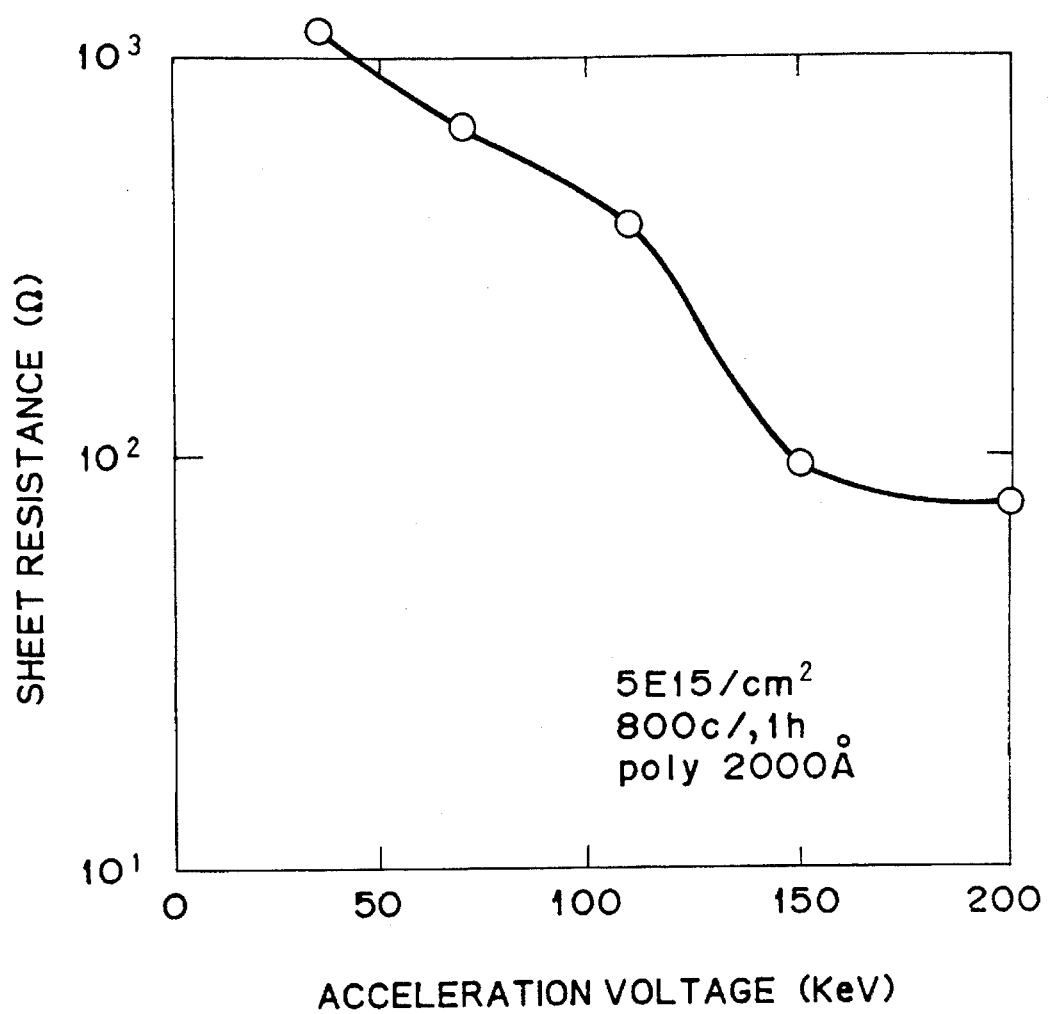
FIG. 12 is a graph showing the relationship between acceleration voltage of As ion injection and sheet resistance of polycrystalline silicon.

FIG. 12 shows the relationship between the acceleration voltage of As ion injection and the sheet resistance value of the polycrystalline silicon. The injected amount is 5E15/cm$^2$ or more, the film thickness of the polycrystalline silicon 2000Å, the heat treatment conditions 800° C., one hour. As shown in FIG. 12, at an acceleration voltage of 150 keV to 200 keV, a device having a sheet resistance value lower to great exent than the conditions of low acceleration voltage of the prior art was obtained. In the case of injecting As ions, amorphous formation is effected to a depth of the As concentration of about 2E19/cm$^2$. In the case of injection conditions of As concentration of about 5E15/cm², acceleration voltage of 150 keV, the depth of the amorphous layer Xc is about 1600Å, and therefore when the film thickness of the polycrystalline silicon is made t, the sheet resistance will be abruptly reduced if the condition of 0.8t<Xc is satisfied.

Figure 13:
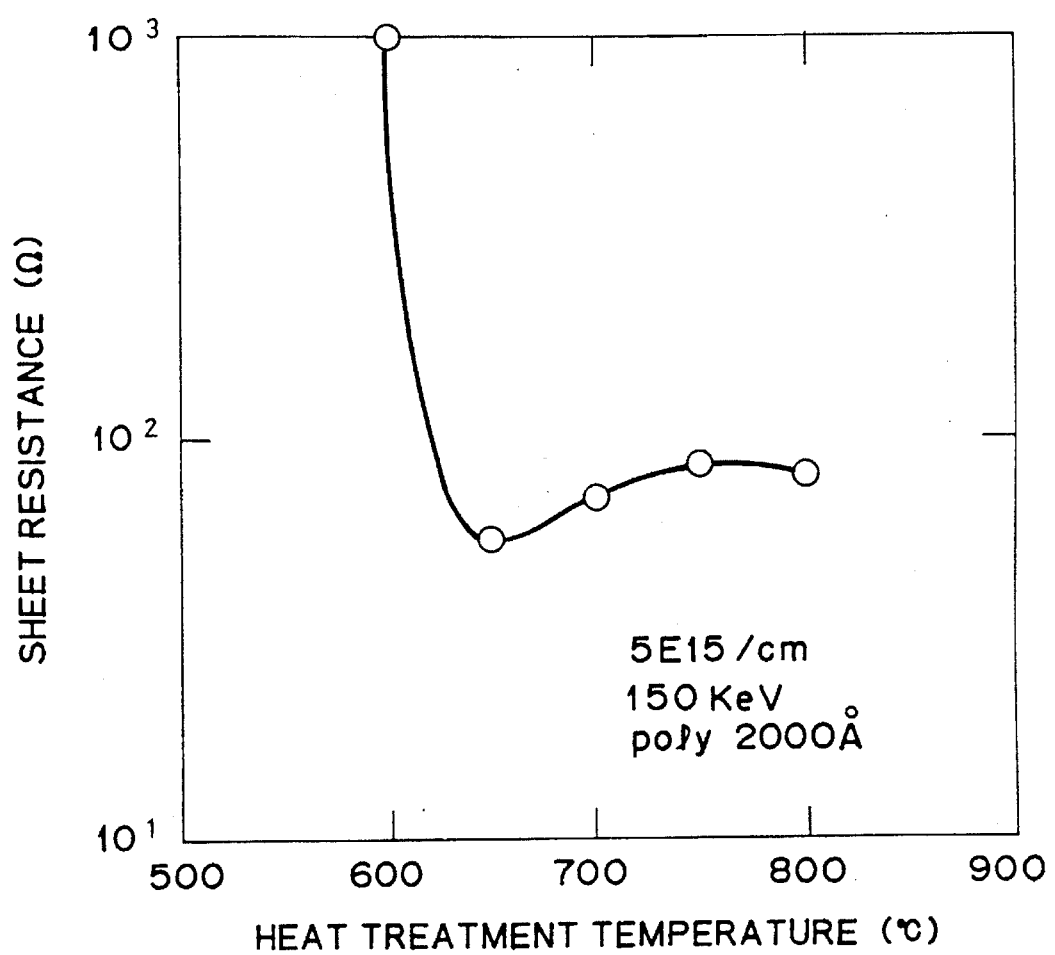
FIG. 13 is a graph showing the relationship between heat treatment temperature after As ion injection and sheet resistance of polycrystalline silicon.

FIG. 13 shows the relationship between the heat treatment temperature after As ion injection and the sheet resistance value of the polycrystalline silicon. The injected amount is 5E15/cm², the acceleration voltage 150 keV, the film thickness of the polycrystalline silicon 2000Å, the heat treatment conditions 800° C., 1 hour. As can be seen from FIG. 13, a low sheet resistance value was obtained at a low temperature of 650° C.

Figure 14:
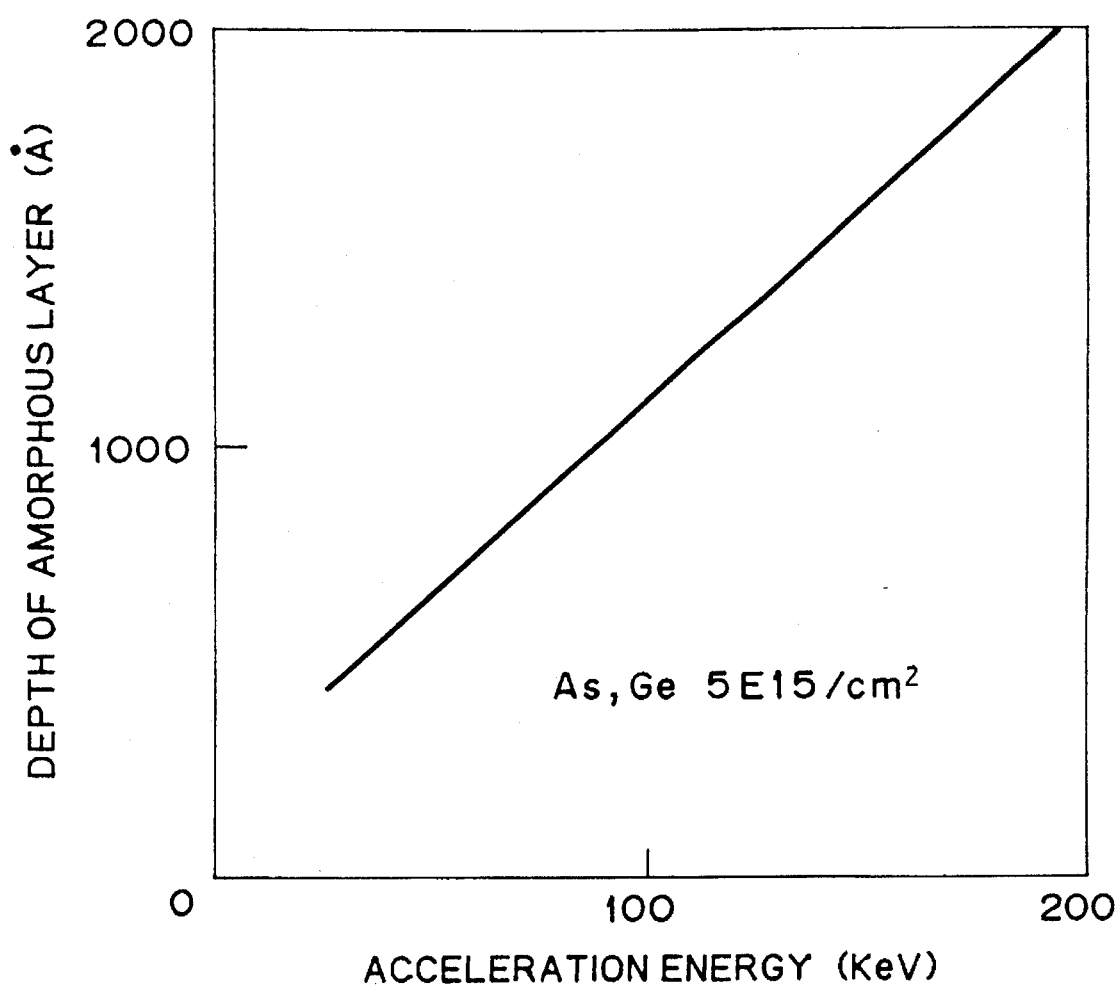
FIG. 14 is a graph showing the relationship between acceleration voltage of ions and depth Xc of amorphous layer.

FIG. 14 shows the relationship between the acceleration voltage and the depth Xc of the amorphous layer in the case of As(Ge) ion injection.

In the above Example, an example of As ion injection was shown as the impurity into the polycrystalline silicon, but in the case of other ion injections, the same effect as in the above Example can be exhibited. The critical injection amounts of various ions for formation of the amorphous layer are as follows:

$B^+$: $2 \times 10^{16}/cm^2$
$P^+$: $1 \times 10^{15}/cm^2$
$As^+$: $3 \times 10^{14}/cm^2$
$Sb^+$: $1 \times 10^{14}/cm^2$

EXAMPLE 7

In the following Example 7 is described by referring to the drawings.

FIGS. 15A to 15F are respectively schematic sectional views for illustration of the primary preparation steps of the silicon-npn bipolar transistor which is an example of the present invention.

FIGS. 16 to 18 are respectively graphs showing the temperatures states in the first heat treatment and the second heat treatment.

By referring to FIGS. 15A to 15F, the formation methods of the respective parts are successively described.

Figure 15A:
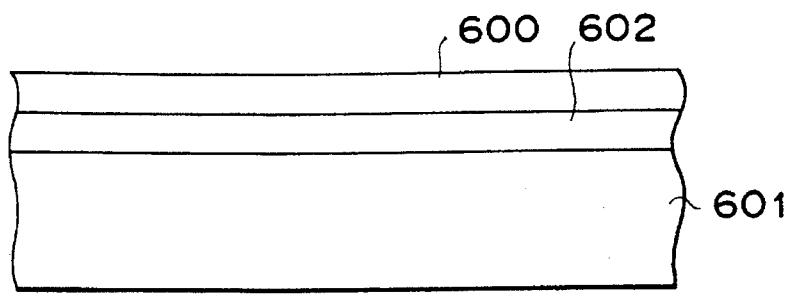

(a) First, as shown in FIG. 15A, on the n-type substrate 601 were formed the p-type diffused layer and the oxidized film 600 which became the base of the transistor.

Figure 15B:
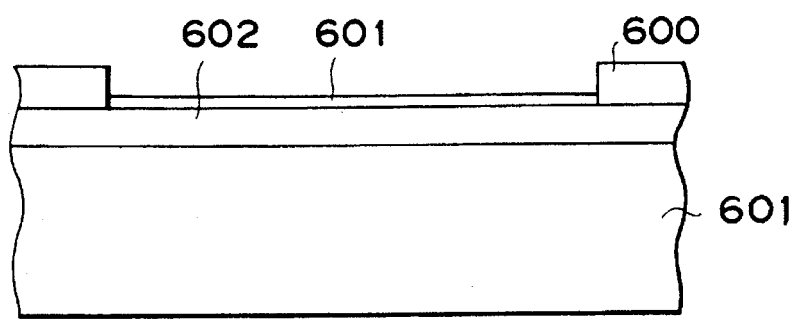

(b) Next, as shown in FIG. 15B, after the contact hole for emitter formation was prepared by etching, the ultra-thin film oxidized film 601 (thickness 50Å or less) (hereinafter called "tunnel oxidized film") of which the impurity diffusion coefficient is smaller than the polycrystalline Si was formed.

Figure 15C:
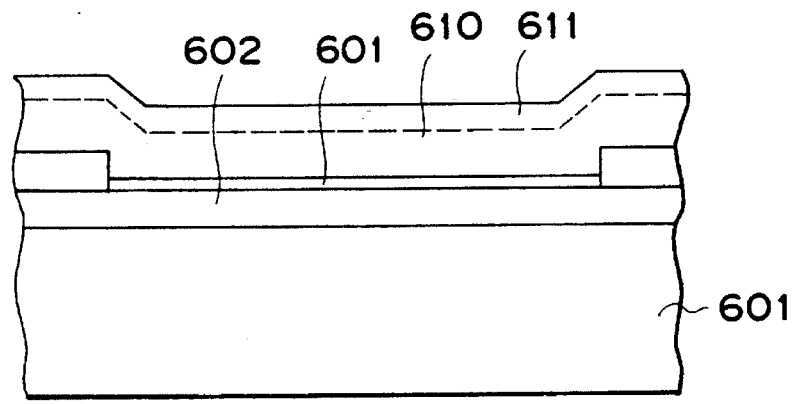

(c) Next, as shown in FIG. 15C, the polycrystalline Si was deposited according to the low pressure chemical vapor deposition method (hereinafter LPCVD method) to form the polycrystalline Si deposited layer 610, and then the impurity species As, P, etc. to be injected into the substrate 1 were injected through the surface of the polycrystalline Si deposited layer 610 according to the ion injection method to form the region 611 indicated by the broken line.

Figure 15D:
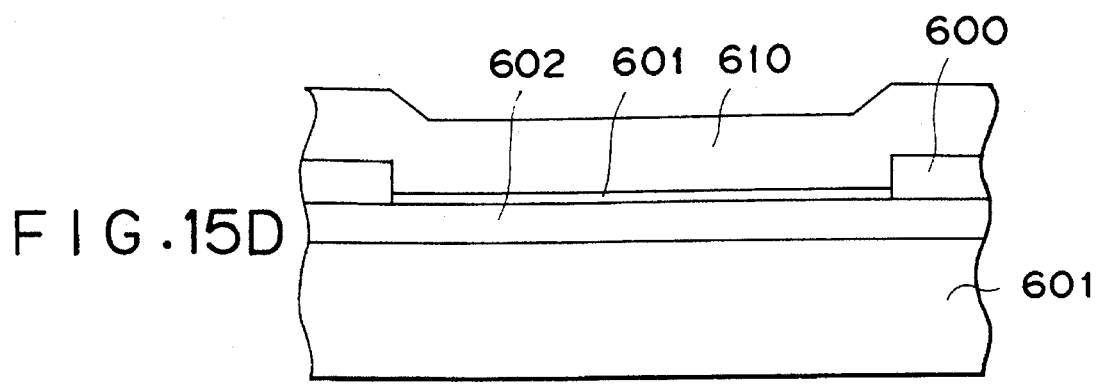

(d) Next, as shown in FIG. 15D, by the first heat treatment (at a constant temperature of 600° to 800° C.), the impurity was diffused into the polycrystalline Si deposited layer 610 region to at least before the tunnel oxidized film 601, to form a uniform impurity layer at the grain boundary layer between the tunnel oxidized film 601.

Figure 15E:
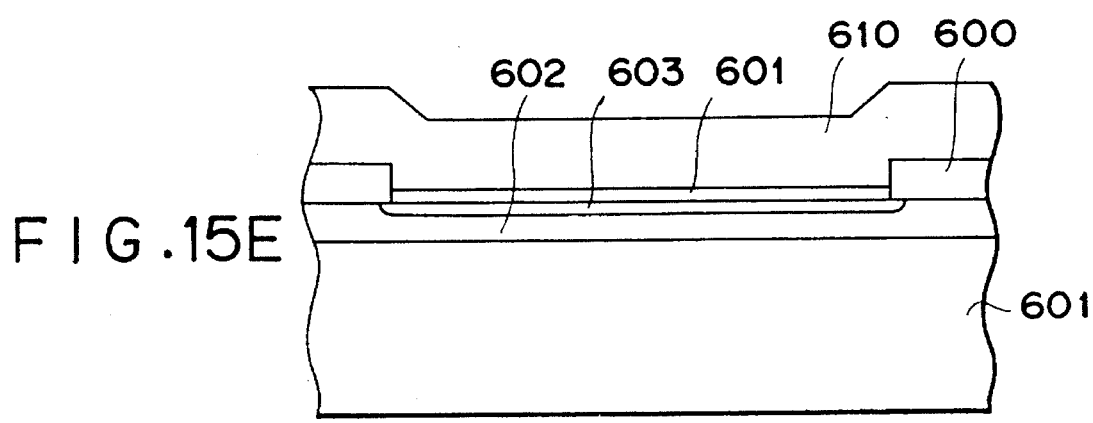

(e) Next, as shown in FIG. 15E, the impurity was passed from the impurity layer formed by the first heat treatment shown in FIG. 15C through the tunnel oxidized film 601 by the second heat treatment under high temperature (a constant temperature of 800° to 950° C.) than the first heat treatment to form the n+ diffused layer 603 which became the emitter. Here, the temperature elevation between the first heat treatment and the second heat treatment was made a considerably abrupt temperature elevation (5° C./min.) as shown in FIG. 16.

Figure 15F:
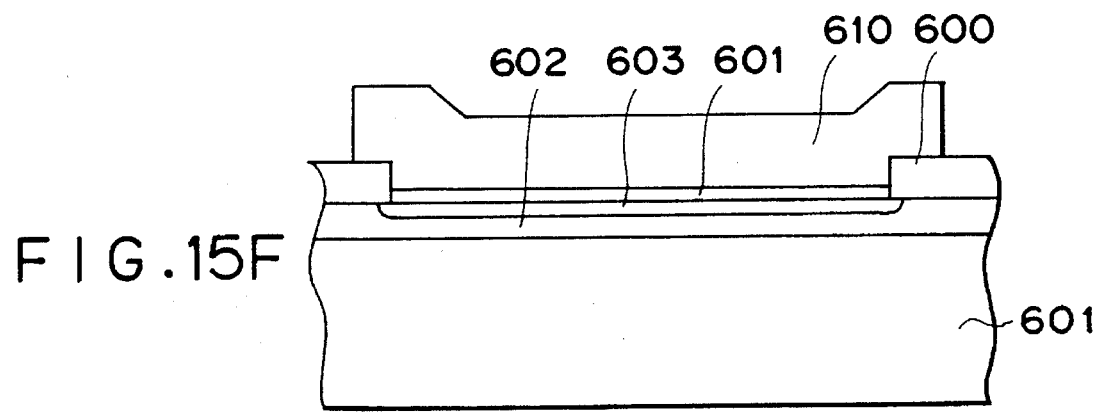

(f) Next, as shown in FIG. 15F, by patterning the polycrystalline Si deposited layer 610, electrodes were formed.

The above preparation steps can be also carried out without separation into the step (e) and the step (f), but successively according to continuous temperature elevation as shown in FIG. 17 or according to stepwise temperature elevation as shown in FIG. 18. In this case, the first heat treatment is carried out on the lower temperature side in the Figure and the second heat treatment on the higher temperature side in the Figure.

According to the two kinds of steps as 20 mentioned above, simplification of the treatment could be effected. Also, the step (f) may be also replaced with the heat treatment at a high temperature (for example, 1000° C), within a short time (for example 10 seconds) according to the Rapid Thermal Anneal (RTA) method.

Next, diffusion in the polycrystal is described.

The polycrystal is a mass of monocrystals having a distribution in sizes, with the crystal grain having no constant crystal direction. And, the respective crystal grains have a crystal grain boundary which is the mutual grain boundary, having there a remarkable disturbance of lattice there. The presence of such crystal grain boundary is a cause for the polycrystal having different characteristics from monocrystal.

And also diffusion of the impurity is greatly influenced by the crystal grain sizes of the respective crystal grains and the lattice defect density of the crystal grain boundary.

More specifically, diffusion in the polycrystal can be classified largely into the diffusion through the crystal grain boundary (diffusion constant $D_{gb}$) and the diffusion within each crystal grain (diffusion constant $D_g$), and the whole effective diffusion constant $D_{eff}$ is represented by the following formula.

$$D_{eff} = (1-f)D_g + fD_{gb} \qquad (2)$$

Here, f is the ratio of the impurity species existing in the crystal grain boundary, and as a model, in the case of a cubic grain size, $$f = 3k \cdot delta/Lg \qquad (2)$$

In the formula, k: segregation coefficient to grain boundary, delta:crystal grain boundary width, Lg:crystal grain size.

Here, the value of k is generally 1 or more, namely a value of about 20 to 1250. On the other hand, delta is ca. 5Å, Lg is determined on the polycrystal deposition conditions, being 100Å to some 1000Å. In the case of a polycrystal, ordinarily $D_{gb} \gg D_g$. The relationship between $D_{eff}$ and D is $D_{eff} \gg D$.

Figure 19:
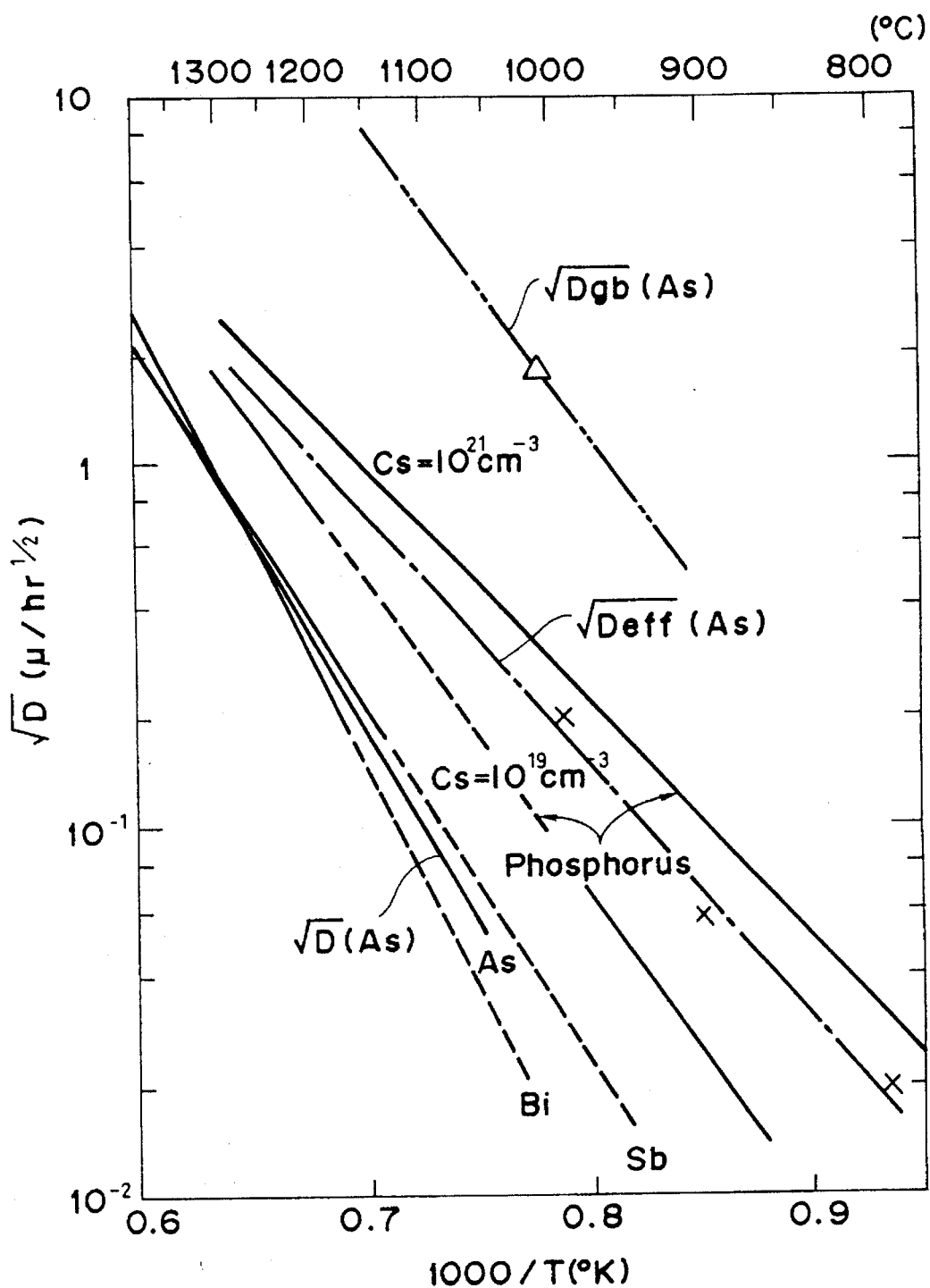
FIG. 19 is a diagram showing the diffusion coefficients of n-type impurities in Si crystal.

FIG. 19 is a graph showing the diffusion coefficient for the n-type impurity. In the Figure, the axis of abscissa is 1000/T (° K) and the axis of ordinate the diffusion coefficient ($\sqrt{D}$) (um/hr$^{1/2}$).

In the Figure, the diffusion coefficient ($\sqrt{D}$) in the monocrystal is shown for the impurities As, Bi and P, the effective diffusion coefficient ($\sqrt{D_{\mathit{eff}}}$) (represented by the mark x) and the diffusion coefficient of the grain boundary ($\sqrt{D_g}$) (represented by the mark Δ) in the polycrystal are shown only for the impurity As. As can be seen from the Figure, the diffusion coefficient ($\sqrt{D}$) in the monocrystal of As and the effective diffusion coefficient ($\sqrt{D_{\mathit{eff}}}$) and the grain boundary diffusion coefficient ($\sqrt{D_g}$) in the polycrystal are respectively different by about 10-fold.

Figure 20:
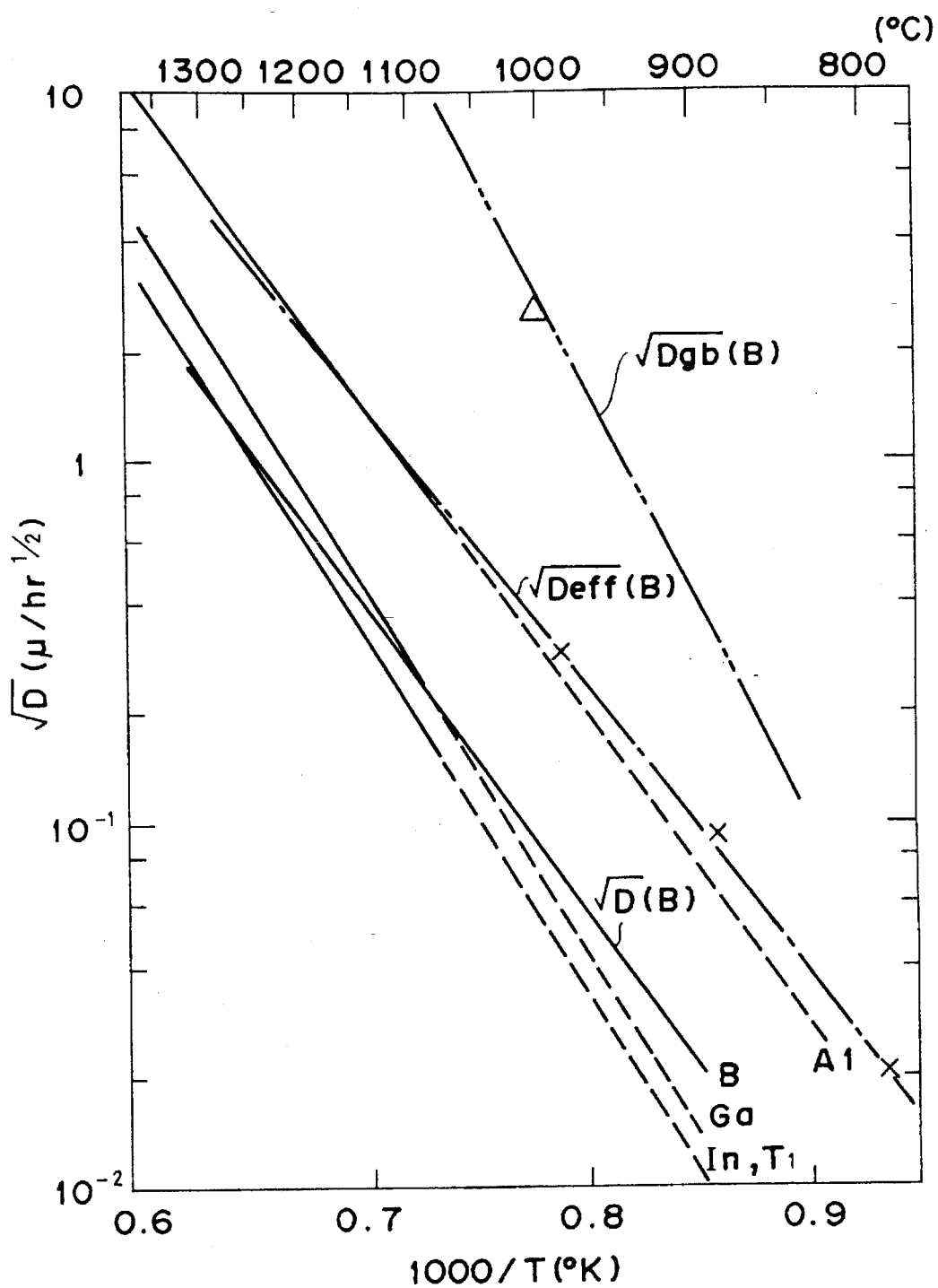
FIG. 20 is a diagram showing the diffusion coefficients of p-type impurities in Si crystal.

FIG. 20 is a graph showing the diffusion coefficients of the p-type impurity.

In the Figure, the diffusion coefficient ($\sqrt{D}$) in the monocrystal is shown for the impurities Al, B, Ga, In, Tl, and the effective diffusion coefficient ($\sqrt{D_{\mathit{eff}}}$) (indicated by the mark x) and the grain boundary diffusion coefficient ($\sqrt{D_g}$) (indicated by the mark Δ) in the polycrystal are shown for the impurity B. As can be seen from the Figure, the respective diffusion coefficients for the impurity B are also clearly different by about 1 figure in the order of ($\sqrt{D} \ll \sqrt{D_{\mathit{eff}}} \ll \sqrt{D_{gb}}$).

The segregation coefficient k as previously mentioned is the ratio of the impurity occupying the site of the grain boundary to the ratio of the impurity occupying the site in the crystal grain, and depends on the kind, the concentration, the temperature, the grain size, etc. of the impurity, but qualitatively becomes smaller in the case of high concentration and in the case of high temperature. As, P, etc. have larger coefficients, while B has smaller coefficient. An example is shown in Table 1 (which is, however, different depending on the literature).

TABLE 1

| Impurity (cm³) | | Temperature (°C.) | | | |
|---|---|---|---|---|---|
| | | 700 | 800 | 900 | 1000 |
| As | 2 × 10¹⁹ | | 350 | 230 | 170 |
| | 2 × 10²⁰ | | 180 | 125 | 90 |
| P | 1 × 10²⁰ | 340 | 190 | 115 | 80 |
| | 2.7 × 10²⁰ | 220 | 110 | 65 | 40 |

Figure 21:
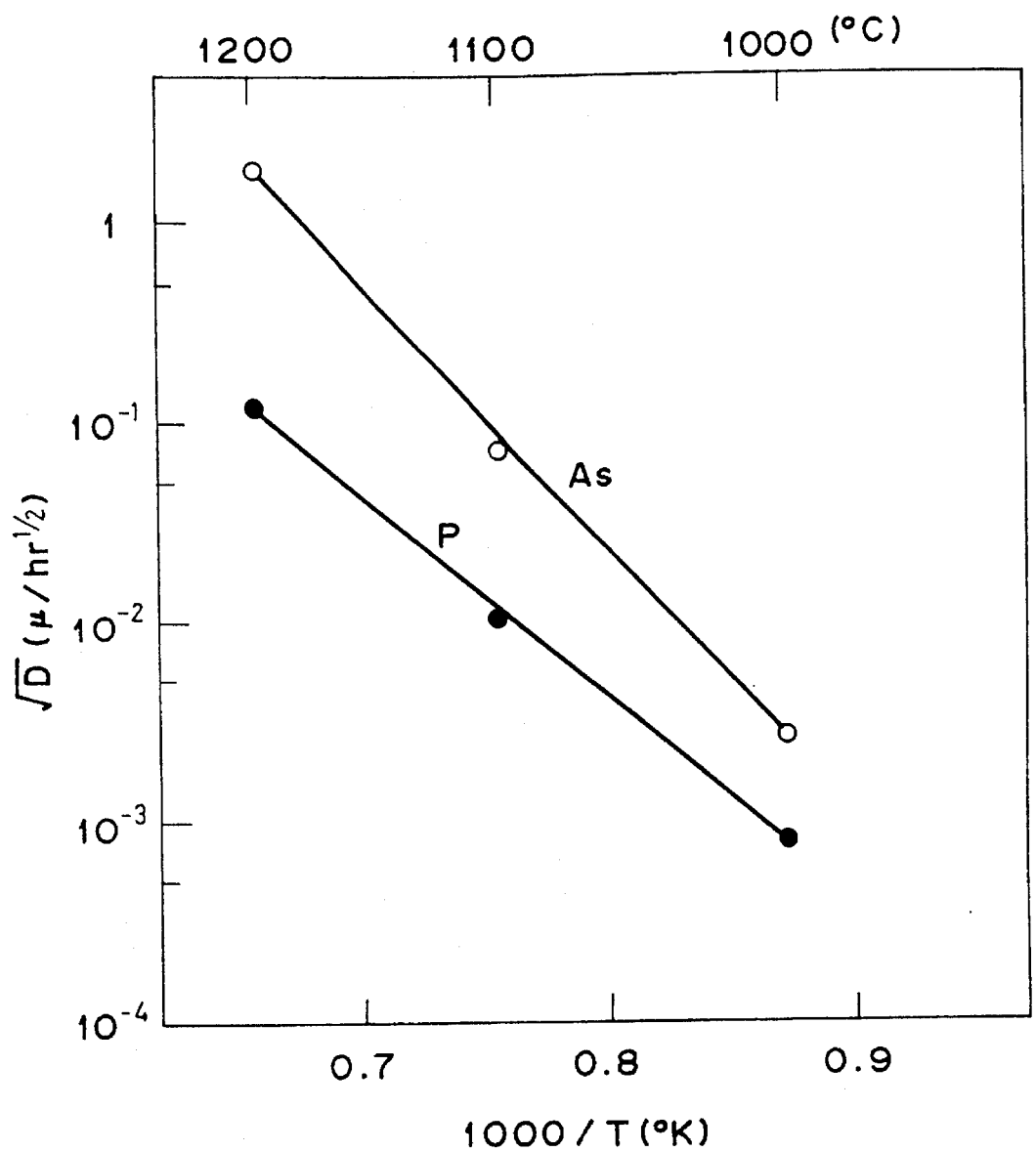
FIG. 21 is a diagram showing the diffusion coefficients of As and P in $SiO_2$ crystal.

FIG. 21 is a graph showing the coefficients of the impurities in the SiO₂ monocrystal, this showing an example when the diffusion constant speed is slow. In the Figure, the axis of abscissa is 1000/T (° K⁻¹), and the axis of ordinate ($\sqrt{D}$) (u/hr^{1/2}). The impurities shown are As and P.

From the Figure, it can be seen that the diffusion coefficient of As is smaller by about double figures (~1/100) as compared with the grain boundary diffusion coefficient shown in FIG. 19.

Next, the reason why the diffused layer is uniformly formed in the substrate is described according to the present invention. When the polycrystalline Si layer 610 is formed on the tunnel oxidized film 601, the grain boundary is necessarily formed between the SiO₂ and the polycrystalline silicon Si.

Figure 22:
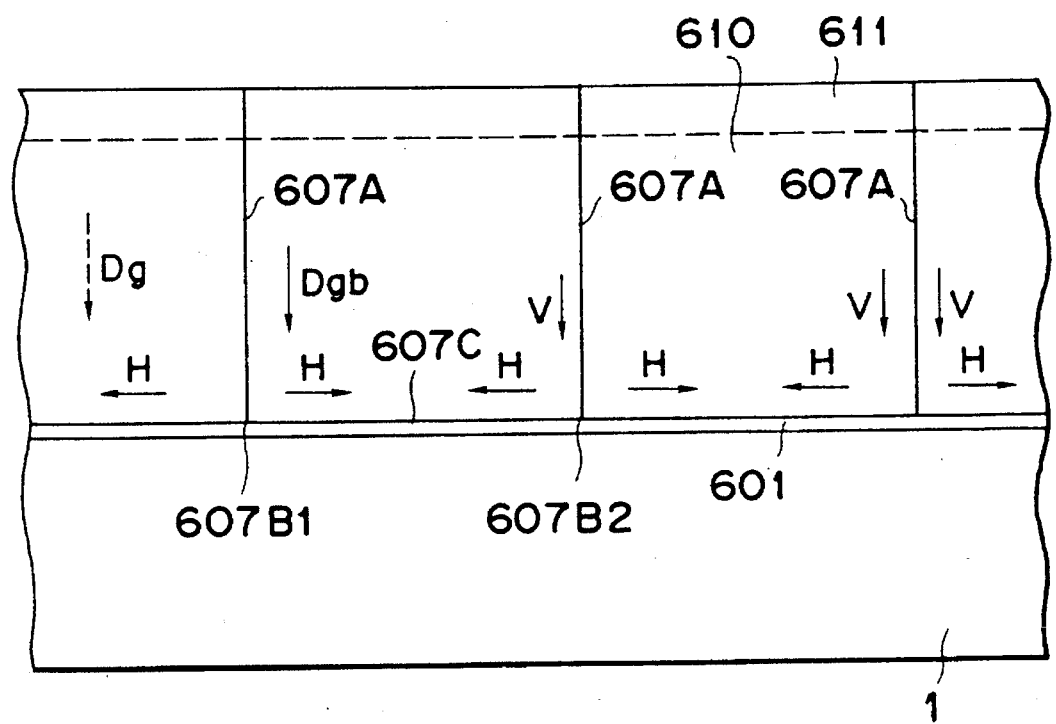
FIG. 22 is a partially enlarged view of FIG. 15.

FIG. 22 is an enlarged view of the polycrystalline Si deposited layer 610, the tunnel oxidized film 601 and the monocrystalline Si substrate 601 shown in FIG. 15.

In FIG. 22, the impuriy ion injected into the polycrystalline Si deposited layer 610 will be mostly diffused along the grain boundary 607A (shown by the arrowhead V), because the diffusion coefficient of the boundary ($\sqrt{D_{gb}}$) is larger by 10-fold or more as compared with the diffusion coefficient within the crystal grain ($\sqrt{D_g}$). Also, since the segregation coefficient is also large in the grain boundary 607A, high concentration region is formed along the grain boundary 607A. Since there is similarly a grain boundary also between the tunnel oxidized film 601 and the polycrystalline Si deposited layer 610, the impurity will be quickly diffused also into the grain boundary 607C (shown by the arrowhead H). And, for example, in the places shown by 607B1 and 607B2 in the Figure, abnormal diffusion into the monocrystal which is the substrate 601 is prevented because the tunnel oxidized film 601 becomes the diffusion barrier. And, in the grain boundary 607C is formed a uniform highly concentrated impurity layer And, by the next second heat treatment, the impurity is diffused from the grain boundary layer 607C into the substrate 601 through the tunnel oxidized film 601, whereby a uniform diffused layer (the layer shown by 3 in FIG. 15E, FIG. 15F) is formed in the substrate 601. Thus, through the tunnel oxidized film 601, the impurity is diffused uniformly from the polycrystalline Si deposited layer 610 into the substrate 601 to form a uniform diffused layer. Whereas, when there is no tunnel oxidized film 601, abnormal diffusion will occur in the above 607B1, 607B2, whereby the junctioned surface is formed nonuniformly.

Figure 23:
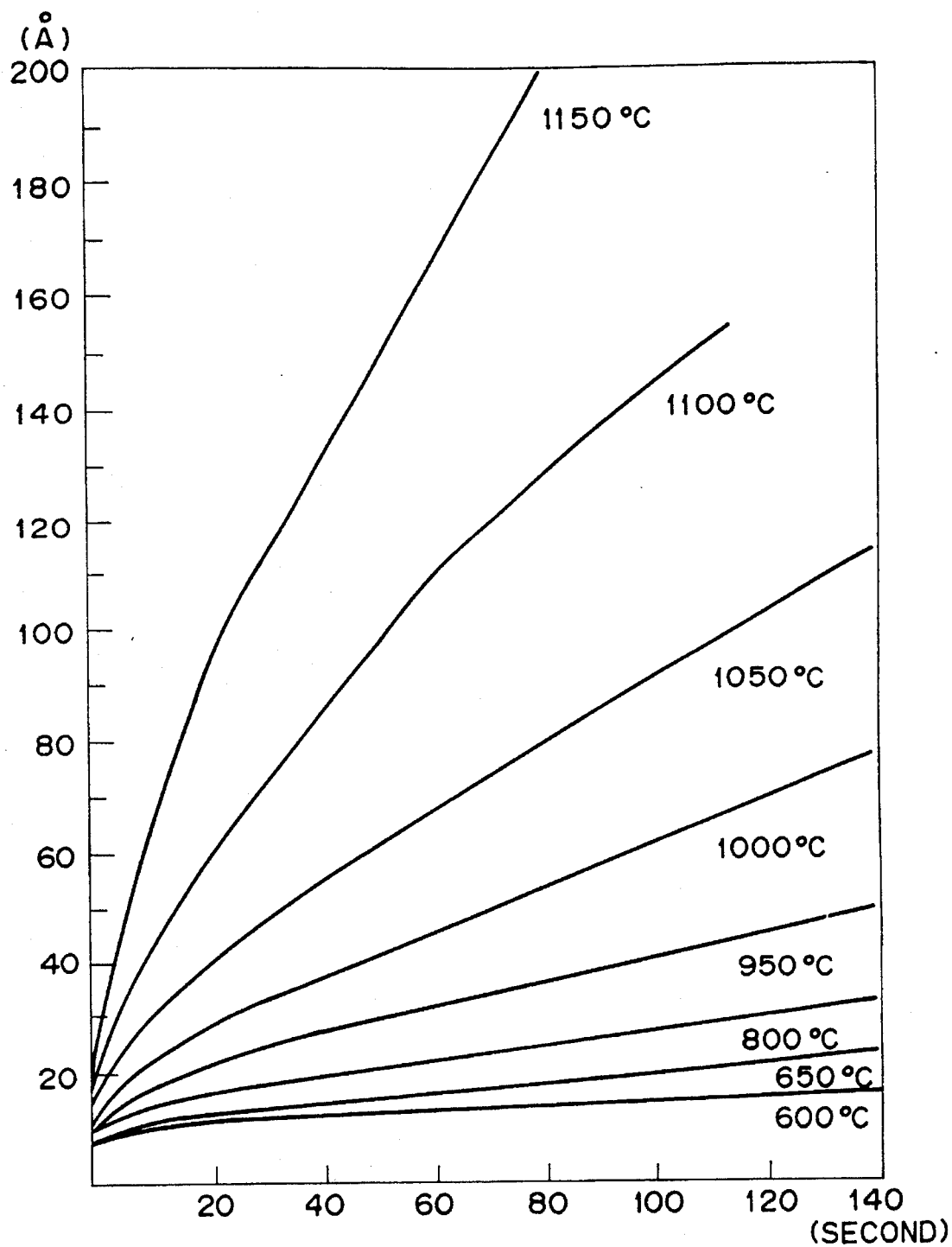
FIG. 23 is a graph showing the relationship between film thickness of oxidized film and injection time when forming an oxidized film by injection of $O_2$ according to Rapid Thermal Anneal (RTA) method.

When the impurity is diffused through the naturally oxidized film, in carrying out the second heat treatment, recrystallization of the polycrystalline Si occurs ordinarily at 950° C. or higher, which is particularly marked at the boundary surface between the polycrystalline Si and the monocrystal, where lattice rearrangement occurs in epitaxial shape from the monocrystalline region 1, and therefore shape variance of junction takes place to give a nonuniform junction face. This may cause variance of the current amplification ratio $h_{FE}$ in the case of the bipolar transistor in integrated circuit. For preventing such phenomenon as described above, it is particularly necessary to prepare a thin stable oxidized film FIG. 23 is a graph showing the relationship between the film thickness of the oxidized film and the time when forming an oxidized film by injection of oxygen according to the Rapid Thermal Anneal method (RTA). In the Figure, the axis of abscissa is time (sec.) and the axis of ordinate is film thickness (A). The parameter is temperature (° C.)

As is apparent from the Figure, it can be seen that the film can be formed with good reproducibility at a film thickness of 10Å or more, and therefore formed stably.

As the material which can be made the diffusion barrier as described above, not only SiO₂, but also Si₃N₄, SiC, etc. with smaller impurity diffusion speed than the polycrystalline Si similarly as SiO₂ may be employed. However, also in this case, it is necessary to make the film thickness ordinarily ca. 50Å so that the carriers may be easily passed through the tunnel effect. Since a naturally oxidized film is not formed stably, it has many pinholes and is weak to the second heat treatment to be broken, and therefore this cannot be utilized. It will rather increase variance of bipolar transistors, etc. Therefore, it is also preferable to introduce the ultra-thin film formation step as in the present invention in order to avoid the influence of such naturally oxidized film.

EXAMPLE 8

FIGS. 24A to 24E are respectively schematic sectional views for illustration of the preparation steps of the silicon-npn bipolar transistor of Example 8 of the present invention.

Figure 24A:
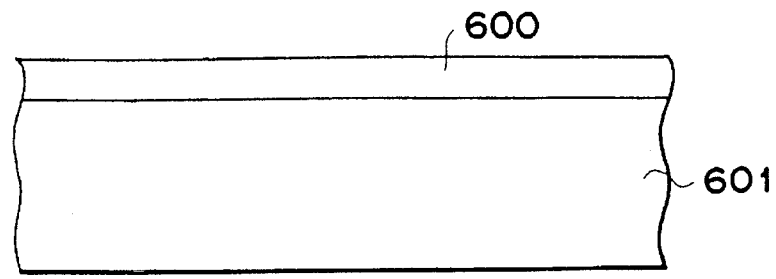
Figure 24B:
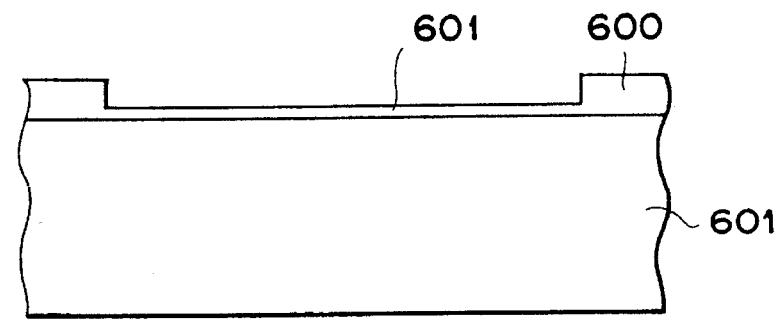
Figure 24C:
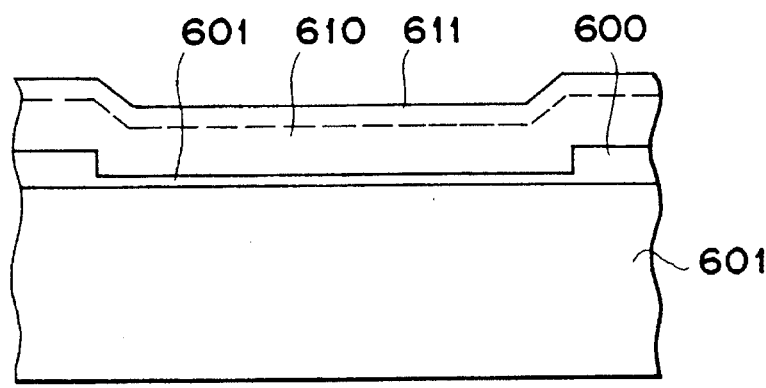
Figure 24D:
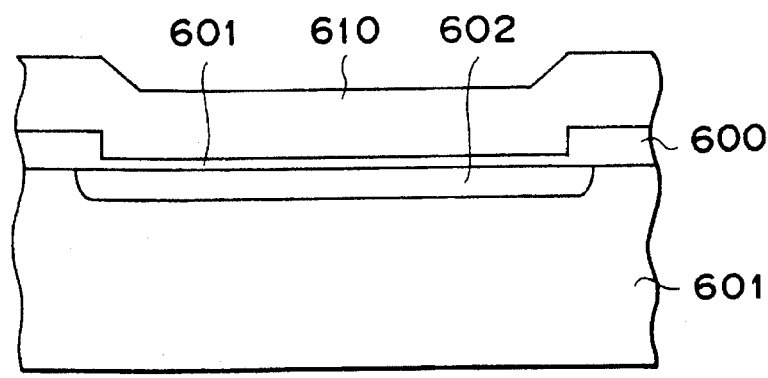

The different point between the process shown in FIG. 15A to FIG. 15F of Example 7 and the present Example is that in the step shown in FIG. 24D, also the region 602 which becomes the base is formed by diffusion through an oxidized film, then the region 603 which becomes the emitter is formed through the tunnel oxidized film 601, thus forming the base and the emitter layer through double diffusion.

Also according to this process, the base and emitter layer could be formed self-matchingly. Thus, by diffusing the impurity through the tunnel oxidized film, various diffused layers could be formed.

Figure 24E:
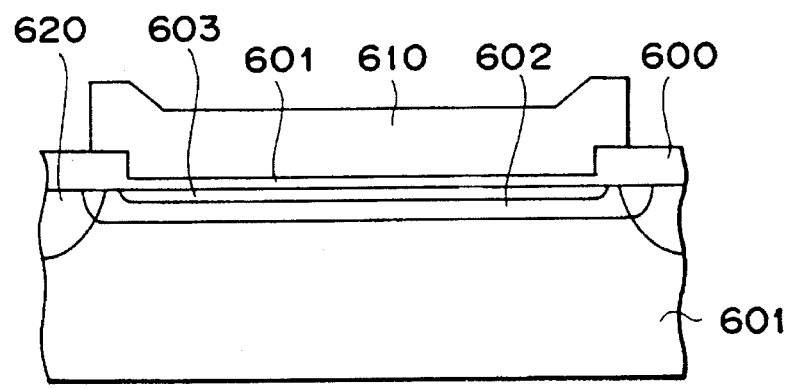

In FIG. 24E, nothing is described about formation of the base take-out portion, but thereafter the external base region 620 by ion injection of B with the electrode 610 as the mask, it can be also prepared self-matchingly.

Alternatively, the electrode can be also taken out by preparing previously the external base region 620 at the peripheral of the base.

As described above, by forming a thin film such as tunnel oxidized film in Examples 7 and 8 on a substrate, abnormal diffusion of impurity and polycrystal recrystallization can be prevented to form a diffused layer having a uniform junctioned face.

Therefore, in the case of a bipolar transistor formed on a substrate, its characteristics can be uniformized and the leak of base current prevent to make the current amplification ratio larger.

Also, when the present invention is applied to a photosensor, variance of its characteristics can be reduced to prepare a photoelectric converting device of high performance with a large S/N ratio.

EXAMPLE 9

Figure 25:
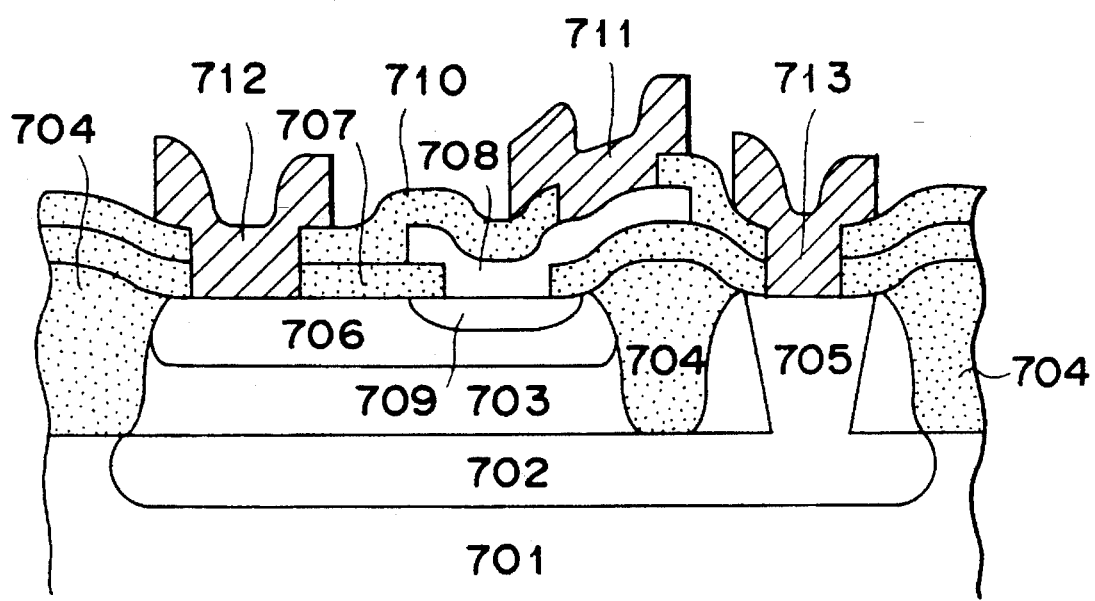

Example 9 is now described by referring to FIG. 25. In FIG. 25, 701 is a p-type silicon substrate, 702 an n-type impurity region such as As or Sb, 703 an n-type epitaxial region, 704 an element separation region, 705 an n-type impurity region provided for collector resistance reduction, 706 a base region, 707 an interlayer insulating layer, 708 a polycrystalline silicon region with large grain size containing an n-type impurity, 709 an n-type emitter region formed by the polycrystalline silicon region 708, 710 an interlayer insulating film, 711 an electrode wiring of emitter, 712 an electrode wiring of base, 713 an electrode wiring of collector.

Figure 26A:
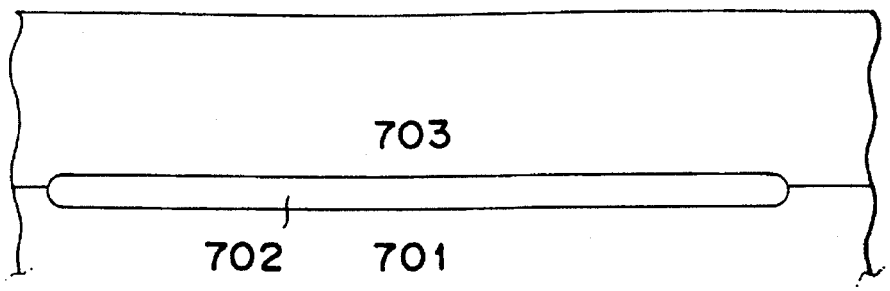
Figure 26B:
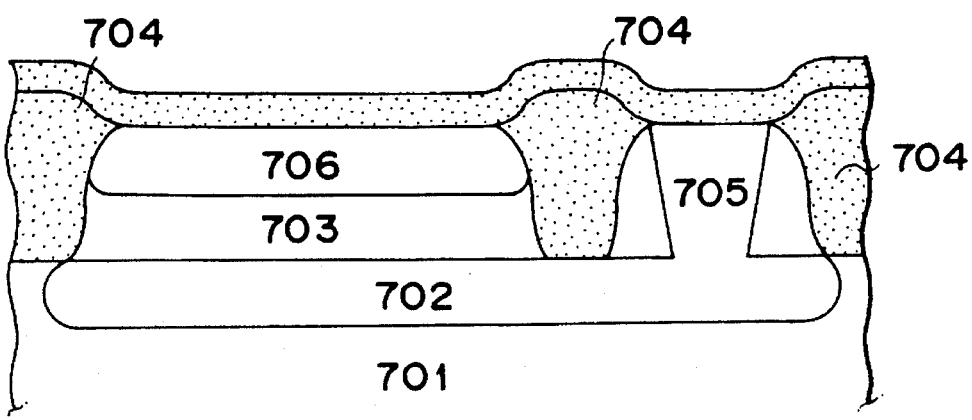
Figure 26C:
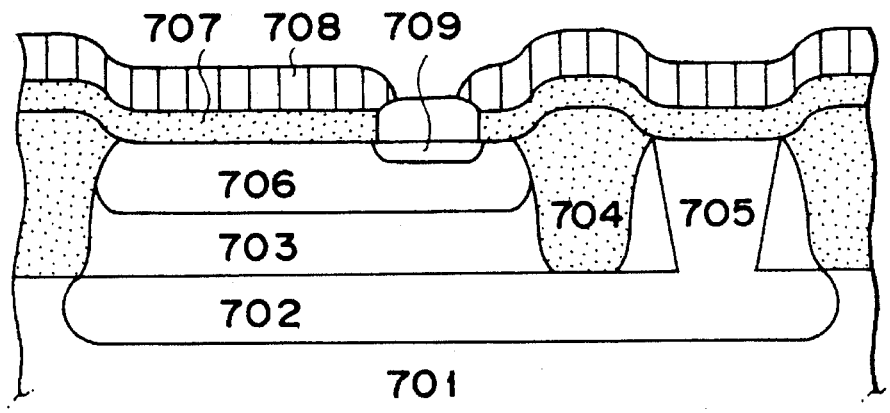

Referring now to FIGS. 26A to 26C, the steps of the process of the present invention are described. First, a p-type silicon substrate containing a p-type impurity such as boron etc. at a concentration of about 1E15 to 1E17 $cm^{-3}$ was thermally oxidized to form an oxidized film with a thickness of about 3000Å to 1 μm. Then, photolithographic treatment was applied and the oxidized film at the desired site was removed by etching. Subsequently, oxidation treatment was again applied to form an oxidized film with a thickness of about 1000Å. Next, after ion injection of an impurity having low vapor pressure and small diffusion constant such as As, Sb, etc., heat treatment for activation was applied.

Subsequently, the oxidized film was removed from the whole surface and epitaxial growth was effected. The epitaxial layer had a thickness of about 2 to 10 μm, containing P, As, etc. at a concentration of about 1E14 to 1E16 $cm^{-3}$. For the n-type impurity region previously formed, the substantial epitaxial layer thickness, which depends also on its formation conditions, is 5 μm or less (FIG. 26A).

Next, the substrate is thermally oxidized to be coated with a nittided film, and then the nitrided film and the oxidized film at the desired sites were removed. With the remaining nittided film as the mask, the substrate was etched and subsequently thermal oxidizing treatment was applied, whereby a thick oxidized film 704 was formed only at the element separation region. Then, by repeating resist mask patterning, ion injection and resist peeling, the regions 705 and 706 were formed (FIG. 26B).

Subsequently, the polycrystalline region 708 and the emitter region 709 were formed. First, the oxidized film at the desired site was removed by etching and the polycrystalline silicon coated with a thickness of about 1000 to 5000Å. Formation of the polycrystalline silicon at this time could be done by use of an He-SiH$_4$ system gas at a temperature of 600° to 700° C. When formed in this temperature region, the growth speed could be taken sufficiently great (about 100Å/min.) and a stable polycrystalline silicon obtained.

Figure 27:
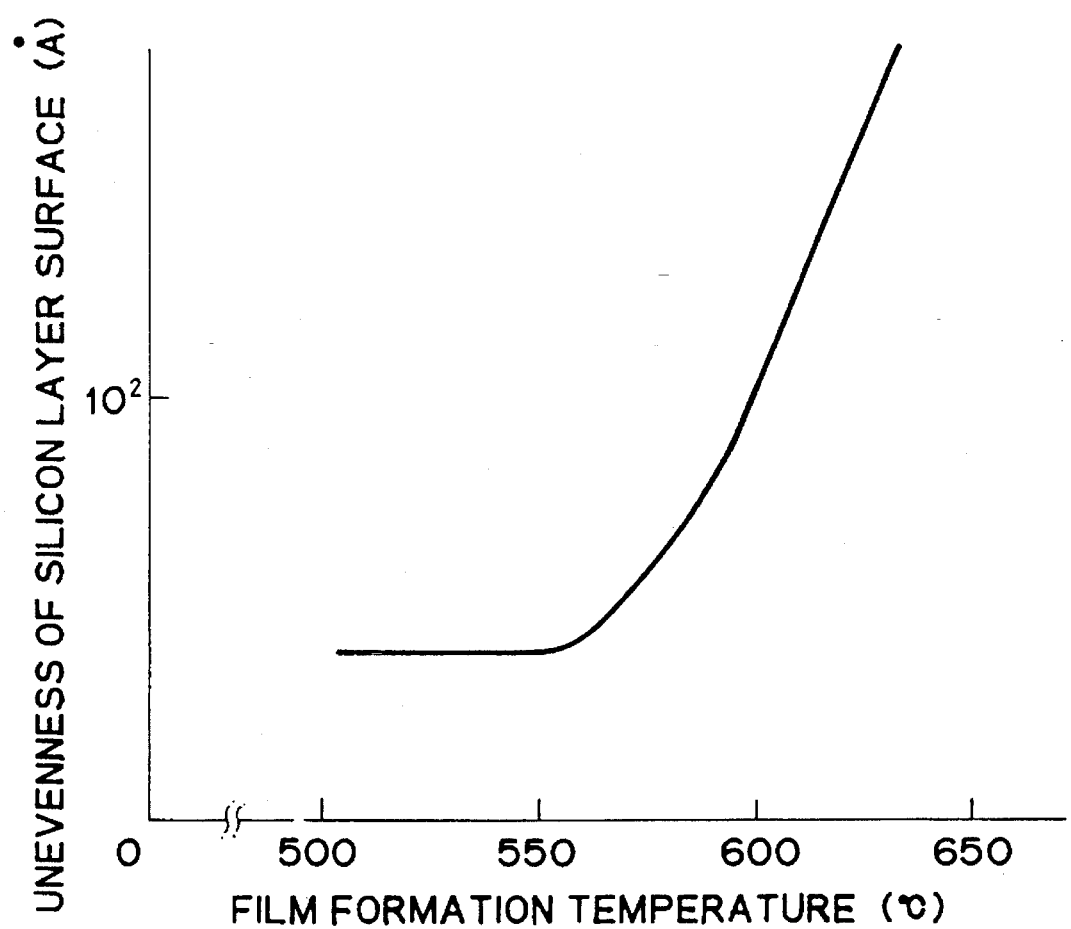
FIG. 27 is a graph showing the relationship between formation temperature and surface unevenness of silicon film.

In the case of a polycrystalline silicon, as its characteristic, unevenness is formed on the surface. When it is desired to have a flat surface by avoiding such unevenness on the surface, a temperature lower than the above range is applied. According to the results of experimentation for forming silicon films under various temperature conditions, as shown in FIG. 27, by forming a silicon layer at a temperature of about 500° C. or lower, an extremely flat surface could be obtained. When crystallinity for formation temperature was evaluated, it was found that the amorphous formation proceeded abruptly as the temperature became 600° C. or lower.

The next steps is the step of ion injection at a concentration of about 1E18 to 1E20 $cm^{-3}$ for introduction of an impurity. The ion species may be of the n-type, and As or P can be advantageously used. By setting the acceleration voltage during ion injection so that the tail of the impurity may become the film thickness of the amorphous layer or more, a uniform diffusion depth could be obtained. For example, when the amorphous layer film thickness is 2000Å, the tail of the imprity is penetrated into the substrate at 130 KeV or higher for As, and at 80 KeV or higher for P. Then, by effecting recrystallization by heat treatment at a temperature of 600° C. or higher, the region 708 comprising a polycrystalline silicon with large grain sizes could be formed (FIG. 26C).

Finally as the interlayer insulating film, a film such as of nittided sulfur glass (NSG), phosphorus glass (PSG) was formed by use of the CVD method, applied with window opening, followed by electrode formation. By doing so, the semiconductor device shown in FIG. 25 is obtained.

Figure 28:
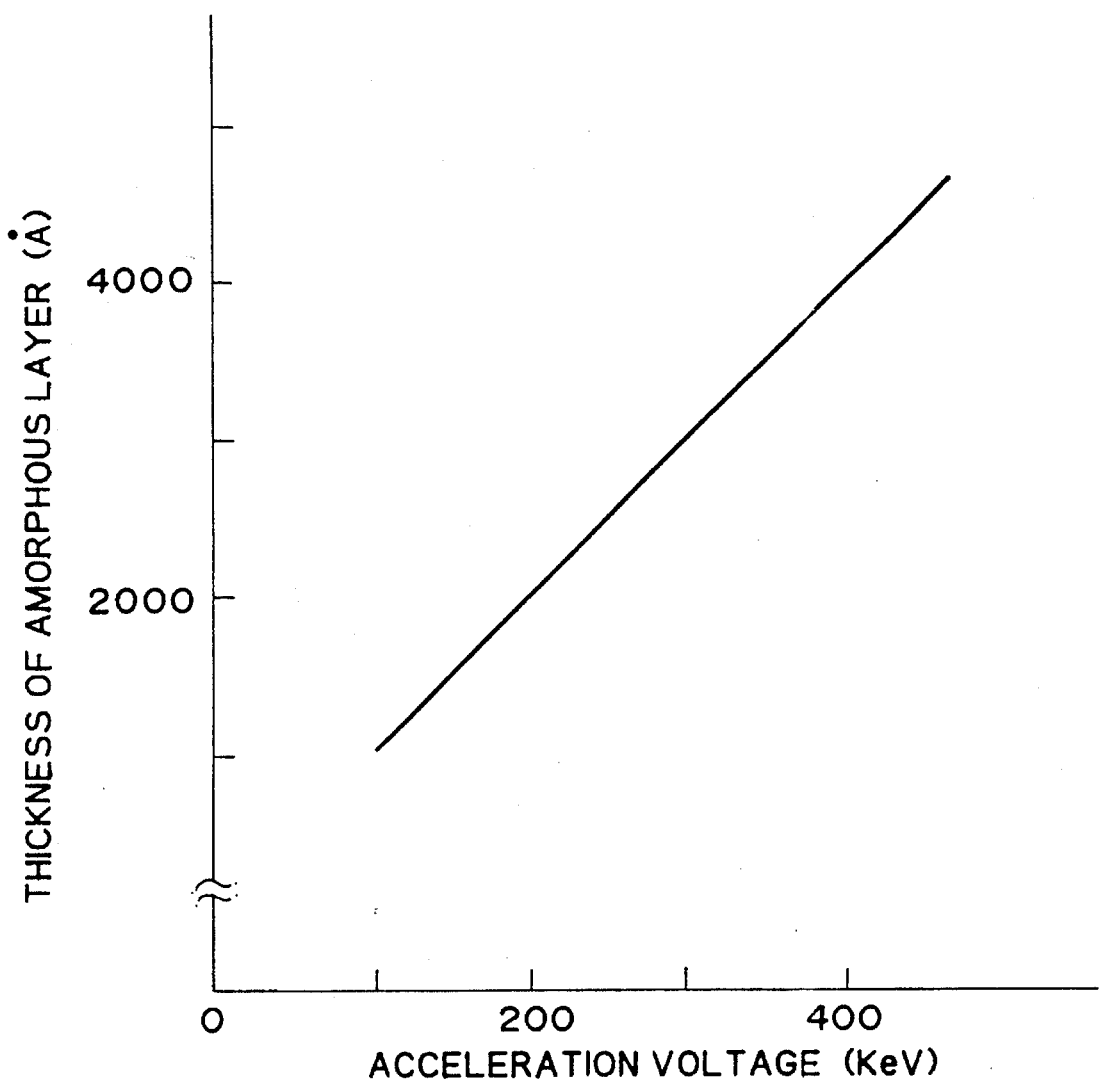
FIG. 28 is a graph showing the relationship between acceleration voltage and amorphous layer temperature during ion injection.

In the above-described Example, description is made about the case of forming the region 709 from a polycrystalline silicon, but the region 709 may be also formed by first forming an amorphous silicon layer with a thickness of, for example, 1000Å to 5000Å, and then injecting inactive ions into the layer. The acceleration voltage during ion injection may be chosen to an appropriate value depending on the thickness of the amorphous layer. FIG. 28 shows the relationship between the thickness of the amorphous layer and the acceleration voltage when the ion species is $Si^{28}$. For example if it is a polycrystalline silicon with a thickness of 2000Å, the appropriate acceleration voltage is about 200 KeV. Subsequent to the ion injection, the treatments of heat treatment et seq are performed in the same manner as in the foregoing Examples. Since the nucleus density is further reduced by injection of such inactive ions, recrystallization from the substrate will more readily occur. Amorphous formation to substantially the same extent is effected when Ge or C is employed other than Si as the inactive ions.

In the above-described Example, the case of applying the present invention to preparation of bipolar transistor is shown, but it is similarly applicable to prepartion of the MOS transistor of a polycrystalline silicon gate. Since no diffusion from the polycrystalline silicon exists in this case, the resistance value can be lowered by lowering the temperature during gate electrode formation. The same is the case when a polycrystalline silicon is used as the wiring material. However, what is formed by recrystallization is a polycrystalline silicon with larger grain sizes.

As described above, according to the preparation process of the present invention, the diffused layer of the emitter region becomes uniform in fine bipolar transistor, whereby a transistor with uniform and stable characteristics can be obtained.

Also, the present invention is excellent with respect to flattening, and therefore can be an effective means for making the device finer.

Further, the present invention can form the devices by means of the preparation device of the prior art, and is also excellent in bulk productivity, etc.

Also, by making the heat treatment for activation after injection of an impurity by the ion injection method into a polycrystalline silicon at least two steps, and by carrying out the treatment in the first step at lower temperature than in the second step, there can be obtained the effects that the sheet resistance of the polycrystalline silicon is reduced and also a shallow junction can be formed.

Further, according to the present invention, by ion injecting the above-mentioned impurity so that the thickness t of the polycrystalline semiconductor region and the thickness Xc of the above-mentioned amorphous region may become the relationship of $0.8t < Xc$, a semiconductor device of low resistance can be easily obtained, and also the heat treatment can be carried out at a low temperature of 600° C. to 650° C.

As described above, according to the present invention, for example, by utilizing an amorphous layer doped with an impurity, although the formation speed of the polycrystalline silicon may be slightly lowered, by lowering of the formation temperature, it has become possible to obtain a low resistance value which could not be achieved in the prior art technique in a low temperature process. Particularly, in the case of a bipolar transistor, variance of $h_{FE}$ could be inhibited to about 1/3 as compared with DOPOS BPT obtained in the prior art method, and further the series resistance of emitter reduced to 1/3 to 1/5. Thus, according to the present invention, there is provided a useful means in fine formation of a semiconductor device.

In addition, according to the present invention, injection of an impurity from the polycrystalline layer to the substrate is done through a thin film, and therefore recrystallization of polycrystal and damaging of naturally oxidized film by heat treatment and damaging of the junctioned face by ion injection can be prevented, whereby the junctioned face of the diffused layers formed in the substrate can be made a uniform and stable junctioned face. Accordingly, it becomes possible to form a very thin diffused layer suitable for higher integration.

And, in the case of a bipolar transistor formed on the substrate, there is no variance of characteristics, whereby an integrated circuit of high performance can be prepared.

Similarly, in the case of a photosensor formed on a substrate, improvement of S/N ratio can be accomplished.

What is claimed is:

1. A process for preparing a semiconductor device which comprises:

forming an insulating thin film capable of tunnelling phenomenon of carriers on a semiconductor substrate;

forming a polycrystalline semiconductor layer on the thin film;

injecting to the surface of the polycrystalline semiconductor layer an impurity, the diffusion coefficient to the thin film of which is smaller than that to the polycrystalline semiconductor layer;

effecting a first heat treatment at a temperature of 800° C. or less to diffuse the impurity injected into the polycrystalline semiconductor layer into the polycrystalline semiconductor layer, thereby forming a uniform or substantially uniform impurity-containing region at least at the thin film side of the polycrystalline semiconductor layer; and effecting a second heat treatment the temperature of which is 950° C. or less, and higher than the temperature of the first heat treatment, to diffuse the impurity present in the polycrystalline semiconductor layer into the semiconductor substrate through the thin film, thereby forming a diffused layer.

2. A process for preparing a semiconductor device according to claim 1, wherein the first heat treatment and the second heat treatment are carried out sequentially by continuous temperature elevation.

3. A process for preparing a semiconductor device according to claim 1, wherein the first heat treatment and the second heat treatment are carried out sequentially by stepwise temperature elevation.

4. A process for preparing a semiconductor device according to claim 1, wherein the semiconductor substrate comprises a semiconductor material containing Si.

5. A process for preparing a semiconductor device according to claim 1, wherein the temperature of the first heat treatment is 600° C. or more.

6. A process for preparing a semiconductor device according to claim 1, wherein the temperature elevation between the first heat treatment and the second heat treatment is made 5° C./min. or higher.

7. A process for preparing a semiconductor device according to claim 1, wherein the thin film is an oxidized film.

8. A process for preparing a semiconductor device according to claim 1, wherein the thin film is at least one material selected from $Si_3N_4$, SiC and $SiO_2$.

9. A process for preparing a semiconductor device according to claim 1, wherein the temperature of the second heat treatment is 800° C. or more.

10. A process for preparing a semiconductor device according to claim 1, wherein the temperature of the first heat treatment is 600° C. or more and the temperature of the second heat treatment is 800° C. or more.

11. A process for preparing a semiconductor device according to claim 1, wherein the diffused layer is a contact region.

12. A process for preparing a semiconductor device according to claim 1, wherein the diffused layer comprises an emitter region.

* * * * *